(12) United States Patent
Kato et al.

(10) Patent No.: US 6,795,328 B2
(45) Date of Patent: Sep. 21, 2004

(54) SEMICONDUCTOR MEMORY DEVICE

(75) Inventors: Yoshiharu Kato, Kasugai (JP);
Kazufumi Komura, Kasugai (JP);
Satoru Kawamoto, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 65 days.

(21) Appl. No.: 10/355,079

(22) Filed: Jan. 31, 2003

(65) Prior Publication Data

US 2003/0223261 A1 Dec. 4, 2003

(30) Foreign Application Priority Data

May 29, 2002 (JP) ....................................... 2002-156144

(51) Int. Cl.$^7$ ................................................. G11C 5/06
(52) U.S. Cl. ........................ 365/63; 365/71; 365/230.06
(58) Field of Search ........................ 365/63, 71, 230.06

(56) References Cited

U.S. PATENT DOCUMENTS 5,822,262 A    10/1998  Hashimoto et al.
6,549,445 B2 *  4/2003  Ooishi et al. ................. 365/63

FOREIGN PATENT DOCUMENTS

| JP | 3-82151 | 4/1991 |
|----|---------|--------|
| JP | 3-165398 | 7/1991 |
| JP | 85659 | 3/1995 |
| JP | 9-214321 | 8/1997 |
| JP | 11-163296 | 6/1999 |
| JP | 11-345488 | 12/1999 |
| JP | 7-86916 | 3/2000 |
| JP | 2000-124415 | 4/2000 |
| JP | 2001-6364 | 1/2001 |
| JP | 2001-320269 | 11/2001 |

* cited by examiner

Primary Examiner—Van Thu Nguyen
Assistant Examiner—Pho M. Luu
(74) Attorney, Agent, or Firm—Arent Fox PLLC

(57) ABSTRACT

A semiconductor memory device having a driver transistor for the supply of electric power is provided, which can diminish leakage current during inactivation while ensuring sufficient power supply capability for a sense amplifier during activation. Gate width is provided at every two bit line pair pitches perpendicularly to a bit line direction, and a supply voltage VDD and a reference voltage VSS are fed to PMOS transistors SP0, SP0_ to SP3, sP3_ and NMOS transistors SN0, SN0_ to SN3, SN3_. In driver-dedicated PMOS transistors P1, P2, and NMOS transistors N1, N2, gate width is adjusted using the length of two bit line pair pitches as a maximum value, while gate length is adjusted using an adjusting region ΔL, whereby there can be obtained driver-dedicated MOS transistors P1, P2, N1, and N2 in an appropriately adjusted state with respect to such characteristics contrary to each other as ensuring sufficient current supply capability and diminishing a tailing current.

36 Claims, 13 Drawing Sheets

CONTROL CIRCUIT FOR DRIVER-DEDICATED MOS TRANSISTOR

FIG.1 LAYOUT DIAGRAM SHOWING MEMORY-CELL ARRAY STRUCTURE OF EMBODIMENT

FIG.2 EXPANDED CIRCUIT DIAGRAM OF A-REGIN IN FIG.1

FIG.3 LAYOUT EXAMPLE (1) OF SENSE AMPLIFIER REGION IN SENSE AMPLIFIER BLOCK DIRECTED TO EMBODIMENT

FIG.4 LAYOUT EXAMPLE (2) OF SENSE AMPLIFIER REGION IN SENSE AMPLIFIER BLOCK DIRECTED TO EMBODIMENT

FIG. 5 LAYOUT EXAMPLE OF SENSE AMPLIFIER REGION IN CONTINUOUS SENSE AMPLIFIER BLOCKS DIRECTED TO EMBODIMENT

CONTROL CIRCUIT FOR DRIVER-DEDICATED MOS TRANSISTOR

SPECIFIC EXAMPLE OF LEVEL SHIFTER IN FIG.6

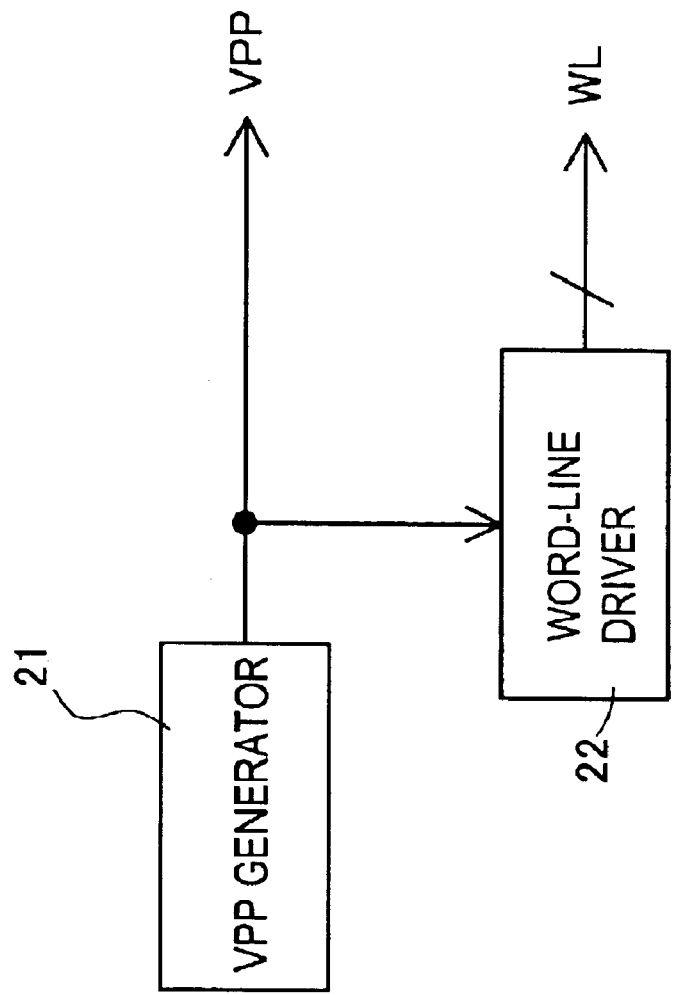
FIG.8 CIRCUIT BLOCK DIAGRAM SHOWING SHARE OF BOOSTING VOLTAGE (VPP) GENERATOR

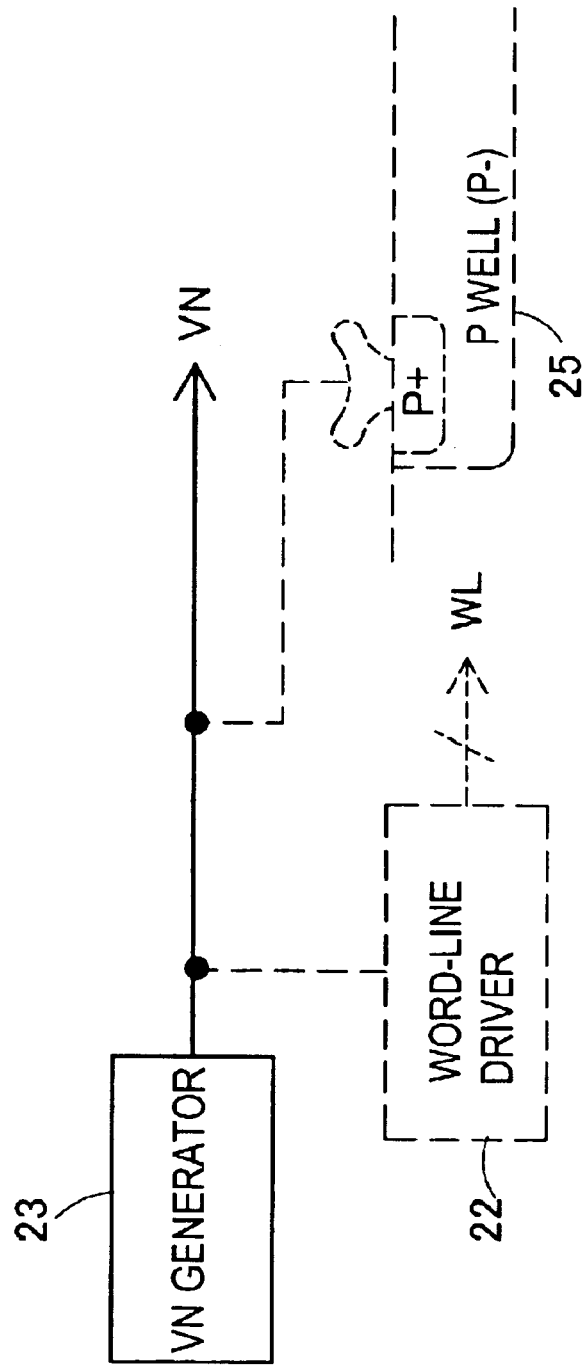
FIG.9 CIRCUIT BLOCK DIAGRAM SHOWING SHARE OF NEGATIVE VOLTAGE (VN) GENERATOR

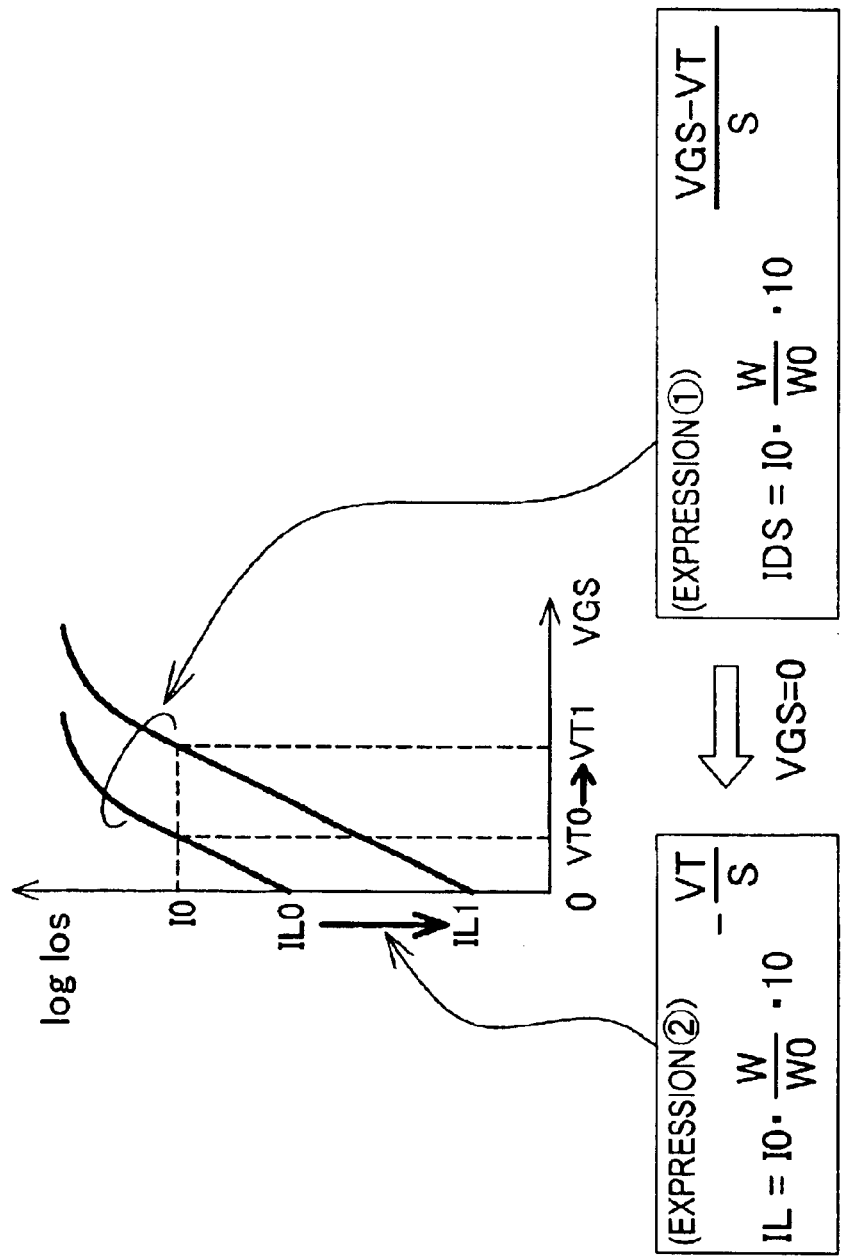
FIG.10 RELATION BETWEEN THRESHOLD VOLTAGE OF MOS TRANSISTOR AND TAILING CURRENT

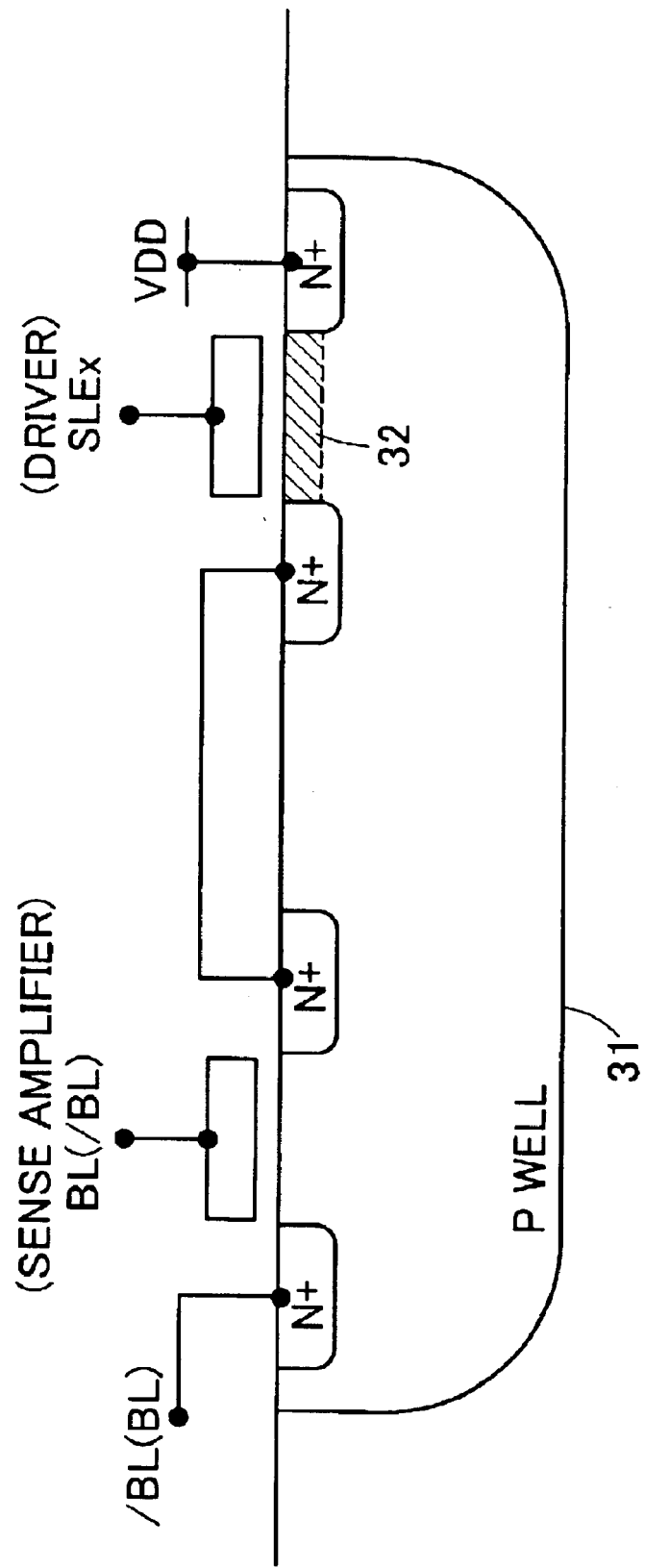
FIG.11 FIRST SPECIFIC EXAMPLE SHOWING STRUCTURAL RELATION BETWEEN DRIVER - DEDICATED MOS TRANSISTOR AND SENSE - AMPLIFIER - DEDICATED MOS TRANSISTOR

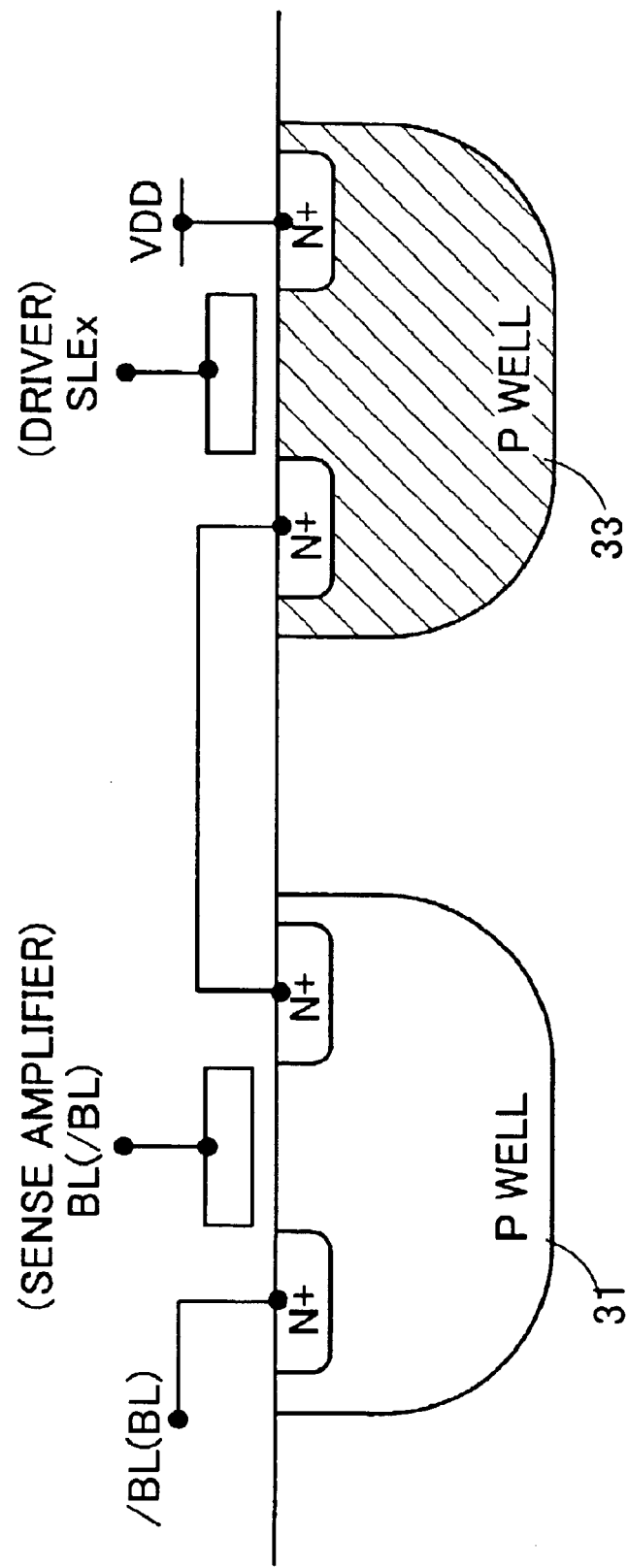
FIG.12 SECOND SPECIFIC EXAMPLE SHOWING STRUCTURAL RELATION BETWEEN DRIVER - DEDICATED MOS TRANSISTOR AND SENSE - AMPLIFIER - DEDICATED MOS TRANSISTOR

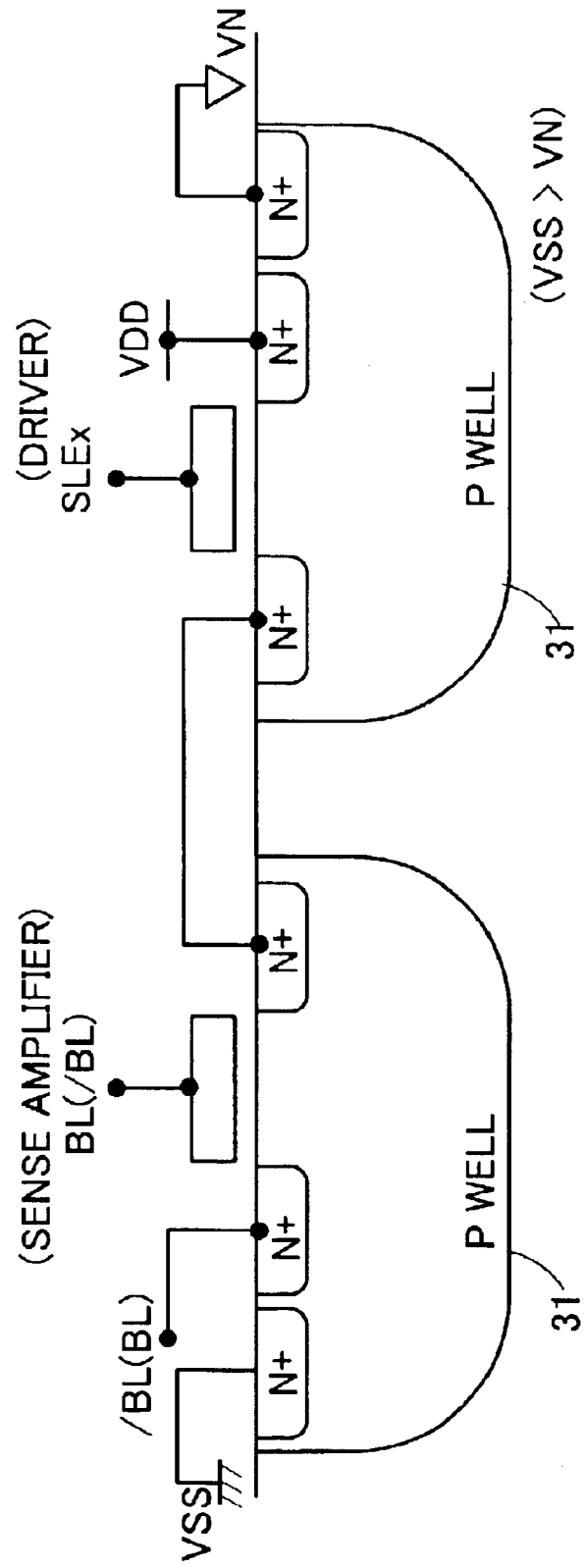
FIG.13 THIRD SPECIFIC EXAMPLE SHOWING STRUCTURAL RELATION BETWEEN DRIVER - DEDICATED MOS TRANSISTOR AND SENSE - AMPLIFIER - DEDICATED MOS TRANSISTOR

SEMICONDUCTOR MEMORY DEVICE

BACKGROUND OF THE INVENTION

1. Field of the Invention

The present invention relates to a semiconductor memory device and more particularly to a technique capable of attaining both high-speed access and low current consumption in an inactive state.

2. Description of Related Art

As the digital system becomes more and more high in its function, both large memory storage and high speed of data access are being required of a semiconductor memory device.

For the speed-up of data access it is necessary to attain the speed-up of a sense amplifier which amplifies read memory cell data. To this end it is necessary to improve the drivability of a driver which supplies electric power to the sense amplifier. The sense amplifier is constructed so as to be supplied with electric power and activated at the time of performing an amplifying operation and not supplied with electric power in an inactive state thereof. The driver is provided with a driver-dedicated MOS transistor which provides a connection between the sense amplifier and a power supply, and it turns conductive in the amplifying operation to supply electric power to the sense amplifier. Improving the drivability for ensuring as sufficient supply of electric power to the sense amplifier means decreasing ON-resistance while the driver is conductive. Therefore, it is necessary to use a driver-dedicated MOS transistor having a sufficient gate width W and sufficient current drivability. Further, it is necessary to ensure a sufficient wiring region for the driver-dedicated MOS transistor.

With an increase of capacity, the number of sense amplifiers used increases, resulting in that the layout region of a group of sense amplifiers supplied with electric power from one driver-dedicated MOS transistor becomes very wide and a positional relation between the driver-dedicated MOS transistor and the sense amplifiers differs greatly sense amplifier by sense amplifier. For ensuring a high-speed performance of the sense amplifier located at the remotest point it is necessary to use a driver-dedicated MOS transistor having a large gate width W.

In view of the above-mentioned circumstances there heretofore has been proposed a dispersive layout of driver-dedicated MOS transistors in which driver-dedicated MOS transistors are embedded dispersively in a sense amplifier layout region so that each driver-dedicated MOS transistor is allocated to a predetermined number of sense amplifiers. This method attempts to secure a gate width W having sufficient current drivability and the speed-up of access while minimizing an increase in the layout area of driver-dedicated MOS transistors.

Recently, portable devices which realize high function digital systems have become popular. In a portable device, for improving a continuous operation time characteristic in battery drive, it is absolutely necessary to decrease the power consumption in a stand-by state. In a stand-by state it is absolutely necessary to decrease the leakage current of MOS transistors, etc.

As a typical leakage current in MOS transistor, a drain current is conceivable which is known as a so-called sub-threshold characteristic (tailing characteristic) and which flows when the gate-source voltage bias is below the threshold voltage. With a lowering of the threshold voltage, the sub-threshold characteristic (tailing characteristic) becomes more and more conspicuous. If a comparison is made in terms of a predetermined voltage bias of below the threshold voltage, the lower the threshold voltage, the more flows the drain current. If the threshold voltage lowers to below 0.4V or so, it becomes impossible to completely cut off the drain current even with no voltage bias applied between the gate and the source. The drain current in this state is particularly called tailing current.

However, the conventional dispersive layout method intends to ensure sufficient current drivability and high-speed access while minimizing an increase of the layout area of driver-dedicated MOS transistors, so that the overall gate width W of driver-dedicated MOS transistors becomes large. In addition, a source terminal is connected to a power supply and a large voltage is applied between the drain and the source. Coupled with these points, at a low threshold voltage there flows much tailing current, thus giving rise to the problem that it is impossible to attain a low current consumption in a stand-by state.

Further, ensuring sufficient current supply capability of a driver-dedicated MOS transistor which is necessary for the speed-up of data access and decreasing the tailing current of a driver-dedicated MOS transistor which is necessary for attaining a low current consumption in a stand-by state, are in a trade-off relation. Therefore, in the field of portable devices having a high-function digital system, it is important to adjust both characteristics. In the prior art, however, it is impossible to make an adjustment for the simultaneous attainment of both ensuring sufficient current drivability of a driver-dedicated MOS transistor and decreasing the tailing current, such as the adjustment of transistor size, adjustment of voltage bias condition, and adjustment of threshold voltage. This arises a problem in mounting a high-function digital system in a portable device.

SUMMARY OF THE INVENTION

The present invention has been accomplished for solving the above-mentioned problems and it is an object of the invention to provide a semiconductor memory device having a driver transistor for the supply of electric power and capable of diminishing leakage current in an inactive state while ensuring sufficient power supply capability for a sense amplifier in an inactive state.

For achieving the above-mentioned object, according to first aspect of the present invention, there is provided a semiconductor memory device comprising: at least one sense amplifier disposed in at least one sense amplifier layout region correspondingly to a wiring pitch of bit lines; and at least one driver-dedicated MOS transistor for the supply of electric power to the sense amplifier, the driver-dedicated MOS transistor being disposed in the sense amplifier layout region in such a manner that its gate width is oriented perpendicularly to the wiring direction of the bit lines, wherein a power terminal of the sense amplifier and a drain terminal of the driver-dedicated MOS transistor are connected with each other through a low resistance wiring layer.

In the semiconductor memory device according to the first aspect, the driver-dedicated MOS transistor is disposed in the sense amplifier layout region where the sense amplifier is disposed, in such a manner that its gate width direction is perpendicular to the wiring direction of bit lines, and electric power is fed from the drain terminal of the driver-dedicated MOS transistor to the power terminal of the sense amplifier through a low resistance wiring layer.

For the supply of electric power to the sense amplifier with sufficient power supply capability, the driver-dedicated MOS transistor usually has a short gate length and a long gate width. With a long gate width, the gate width can be adjusted freely without being restricted by the wiring pitch of bit lines in a direction perpendicular to the wiring direction of bit lines in the sense amplifier layout region, and it becomes possible to provide a sufficient gate width. As to the gate length, the size of a standard gate length itself is a very small length and hence a sufficient adjustment can be made in an adjustment region of a very small length. Also in a direction parallel to the bit line wiring direction in which the adjustment region is restricted due to a layout restriction of adjacent elements in the sense amplifier layout region, it becomes possible to provide such a gate length as ensures a sufficient adjustment region. Both gate width and gate length can be adjusted with a sufficient degree of freedom and it becomes possible to provide a driver-dedicated MOS transistor of a size adjusted appropriately with respect to such characteristics contrary to each other as ensuring sufficient current supply capability and decreasing the tailing current.

Besides, since the drain terminal of the driver-dedicated MOS transistor and the power terminal of the sense amplifier, both defining a power supply path from the driver-dedicated MOS transistor to the sense amplifier, are connected together by a low resistance wiring layer such as a metal wiring layer, a voltage drop in the wiring path is very small. Also in the case where a single driver-dedicated MOS transistor is connected to a larger number of sense amplifiers, a voltage drop on the power supply path between adjacent sense amplifiers becomes uniform and there is obtained a well-balanced power supply capability for the sense amplifiers.

According to a second aspect of the present invention, there is provided a semiconductor memory device comprising: at least one sense amplifier disposed in at least one sense amplifier layout region correspondingly to a wiring pitch of bit lines; and at least one driver-dedicated MOS transistor for the supply of electric power to the sense amplifier, the driver-dedicated MOS transistor being disposed in the sense amplifier layout region in such a manner that its gate width is oriented perpendicularly to the wiring direction of the bit lines, wherein a power terminal of the sense amplifier and a drain terminal of the driver-dedicated MOS transistor are directly connected with each other by a constituent layer of both the terminals, and an auxiliary path is formed in at least a partial region by a low resistance wiring layer.

In the semiconductor memory device according to the second aspect of the present invention, the driver-dedicated MOS transistor is disposed in the sense amplifier layout region where the sense amplifier is disposed, in such a manner that its gate width direction is perpendicular to the wiring direction of bit lines, and electric power is fed from the drain terminal of the driver-dedicated MOS transistor to the power terminal of the sense amplifier through a wiring path formed by the constituent layer of both terminals and further through an auxiliary path formed concurrently in at least a partial region by a low resistance wiring layer.

According to this construction, as in the first aspect, both gate width and gate length of the driver-dedicated MOS transistor can be adjusted with a sufficient degree of freedom and it becomes possible to provide a driver-dedicated MOS transistor of an appropriately adjusted size with respect to such characteristics contrary to each other as ensuring sufficient current supply capability and decreasing the tailing current.

Moreover, the drain terminal of the driver-dedicated MOS transistor and the power terminal of the sense amplifier can be connected together at a short distance, thus permitting compression of the layout region, and because of such a short-distance wiring it is possible to suppress a voltage drop in the power supply path from the driver-dedicated MOS transistor to the sense amplifier. There concurrently is formed an auxiliary path by a low resistance wiring layer such as a metal wiring layer, so that the load in the power supply path is further diminished and variations in operation between adjacent sense amplifiers are diminished.

According to a third aspect of the present invention, there is provided a semiconductor memory device comprising: at least one sense amplifier disposed in at least one sense amplifier layout region correspondingly to a wiring pitch of bit lines; and at least one driver-dedicated MOS transistor for the supply of electric power to the sense amplifier, the driver-dedicated MOS transistor being disposed in the sense amplifier layout region in such a manner that its gate width is oriented perpendicularly to the wiring direction of the bit lines, wherein the driver-dedicated MOS transistor has a gate length adjustable region between source and drain terminals thereof, the gate length adjustable region permitting a gate layer to be disposed therein which gate layer has a gate length larger than a shortest length value.

In the semiconductor memory device according to the third aspect of the present invention, the driver-dedicated MOS transistor is disposed in the sense amplifier layout region where the sense amplifier is disposed, in such a manner that its gate width is oriented perpendicularly to the wiring direction of bit lines, and the source and drain terminals of the driver-dedicated MOS transistor are arranged while ensuring a gate length adjustable region.

According to this construction, as in the first aspect, both gate width and gate length of the driver-dedicated MOS transistor can be adjusted with a sufficient degree of freedom and it becomes possible to provide a driver-dedicated MOS transistor of an appropriately adjusted size with respect to such characteristics contrary to each other as ensuring sufficient current supply capability and decreasing the tailing current.

Besides, since the driver-dedicated MOS transistor is beforehand provided with the gate length adjustable region, the gate length can be increased and decreased by only adjustment of the gate layer. Thus, in the fabrication of the semiconductor memory device, both current supply capability and tailing current in the driver-dedicated MOS transistor can be adjusted by the correction of only a photomask of the gate layer, and thus it is possible to reduce the adjusting time and cost.

According to a fourth aspect of the present invention, there is provided a semiconductor memory device comprising: a multitude of sense amplifier blocks, the sense amplifier blocks each having in one and same region a predetermined number of sense amplifiers and a driver-dedicated MOS transistor for the supply of electric power to the predetermined number of the sense amplifiers; and a low resistance wiring layer for connecting between the sense amplifier blocks by connecting between power terminals of the predetermined number of the sense amplifiers or connecting between a power output terminal and other power output terminal of respective driver-dedicated MOS transistors in the sense amplifier blocks.

In the semiconductor memory device according to the fourth aspect of the present invention, there are constituted sense amplifier blocks each having in one and same region a driver-dedicated MOS transistor for each predetermined number of sense amplifiers, and power terminals of the predetermined number of sense amplifiers or power output terminal of the driver-dedicated MOS transistor in the sense amplifier block are connected between the sense amplifier blocks by a low resistance wiring layer.

According to this construction, even if the driver-dedicated MOS transistor in a certain sense amplifier block is separated from the predetermined number of sense amplifiers in the same block, electric power is fed thereto from the driver-dedicated MOS transistor in the sense amplifier block adjacent thereto, so that by adjusting connection and non-connection of each individual driver-dedicated MOS transistor it becomes possible to make an appropriate adjustment with respect to such characteristics contrary to each other as ensuring sufficient current supply capability and decreasing the tailing current.

Besides, since connection or non-connection of each individual driver-dedicated MOS transistor can be made depending on whether a contact layer or a low resistance wiring layer is to be laid or not, the adjustment of both current supply capability and tailing current in the driver-dedicated MOS transistor can be made by the correction of a photomask of only one of the contact layer and the low resistance wiring layer, whereby the adjusting time and cost can be reduced.

According to a fifth aspect of the present invention, there is provided a semiconductor memory device including at least one driver-dedicated MOS transistor for the supply of electric power to at least one sense amplifier, wherein in an inactive state not involving an access operation, a difference in applied voltage at a gate terminal relative to a source terminal of the driver-dedicated MOS transistor is reverse-biased relative to a voltage difference in a conductive state.

According to this construction, the driver-dedicated MOS transistor can be reverse-biased more deeply and it is possible to suppress the tailing current while affording a large gate width and a high current drivability. Even in the case where the gate width and length of the driver-dedicated MOS transistor cannot be adjusted to a satisfactory extent, it is possible to make adjustment for ensuring sufficient current drivability and decreasing the tailing current.

According to a sixth aspect of the present invention, there is provided a semiconductor memory device including at least one driver-dedicated MOS transistor for the supply of electric power to at least one sense amplifier, wherein in an active state of the sense amplifier, a difference in applied voltage at a gate terminal relative to a source terminal of the driver-dedicated MOS transistor is forward-biased more deeply than a voltage difference in a conductive state.

According to this construction, the driver-dedicated MOS transistor can be forward-biased more deeply and a higher current drivability can be achieved at a smaller gate width while suppressing the tailing current. Even when the adjustment of gate width and length of the driver-dedicated MOS transistor cannot be made to a satisfactory extent, it is possible to make adjustment for ensuring sufficient current drivability and diminishing the tailing current.

According to a seventh aspect of the present invention, there is provided a semiconductor memory device including driver-dedicated MOS transistor for the supply of electric power to a sense amplifier, the driver-dedicated MOS transistor being deeper in threshold voltage than a sense amplifier-dedicated MOS transistor which constitutes the sense amplifier.

According to this construction it is possible to suppress the tailing current in the driver-dedicated MOS transistor, and even when the adjustment of gate width and length of the driver-dedicated MOS transistor cannot be made to a satisfactory extent, it is possible to make adjustment for ensuring sufficient current drivability and diminishing the tailing current.

BRIEF DESCRIPTION OF THE DRAWINGS

FIG. 8 is a circuit block diagram showing share of a boosting voltage (VPP) generator;

FIG. 9 is a circuit block diagram showing share of a negative voltage (VN) generator;

FIG. 10 is a diagram showing a relation between a threshold voltage of a MOS transistor and a tailing current;

FIG. 11 is a first specific example showing a structural relation between a driver-dedicated MOS transistor and a sense amplifier-dedicated MOS transistor;

FIG. 12 is a second specific example showing a structural relation between a driver-dedicated MOS transistor and a sense amplifier-dedicated MOS transistor; and FIG. 13 is a third specific example showing a structural relation between a driver-dedicated MOS transistor and a sense amplifier-dedicated MOS transistor.

DETAILED DESCRIPTION OF THE PREFERRED EMBODIMENTS

A semiconductor memory device embodying the present invention will be described hereinunder with reference to FIGS. 1 to 13.

Figure 1:
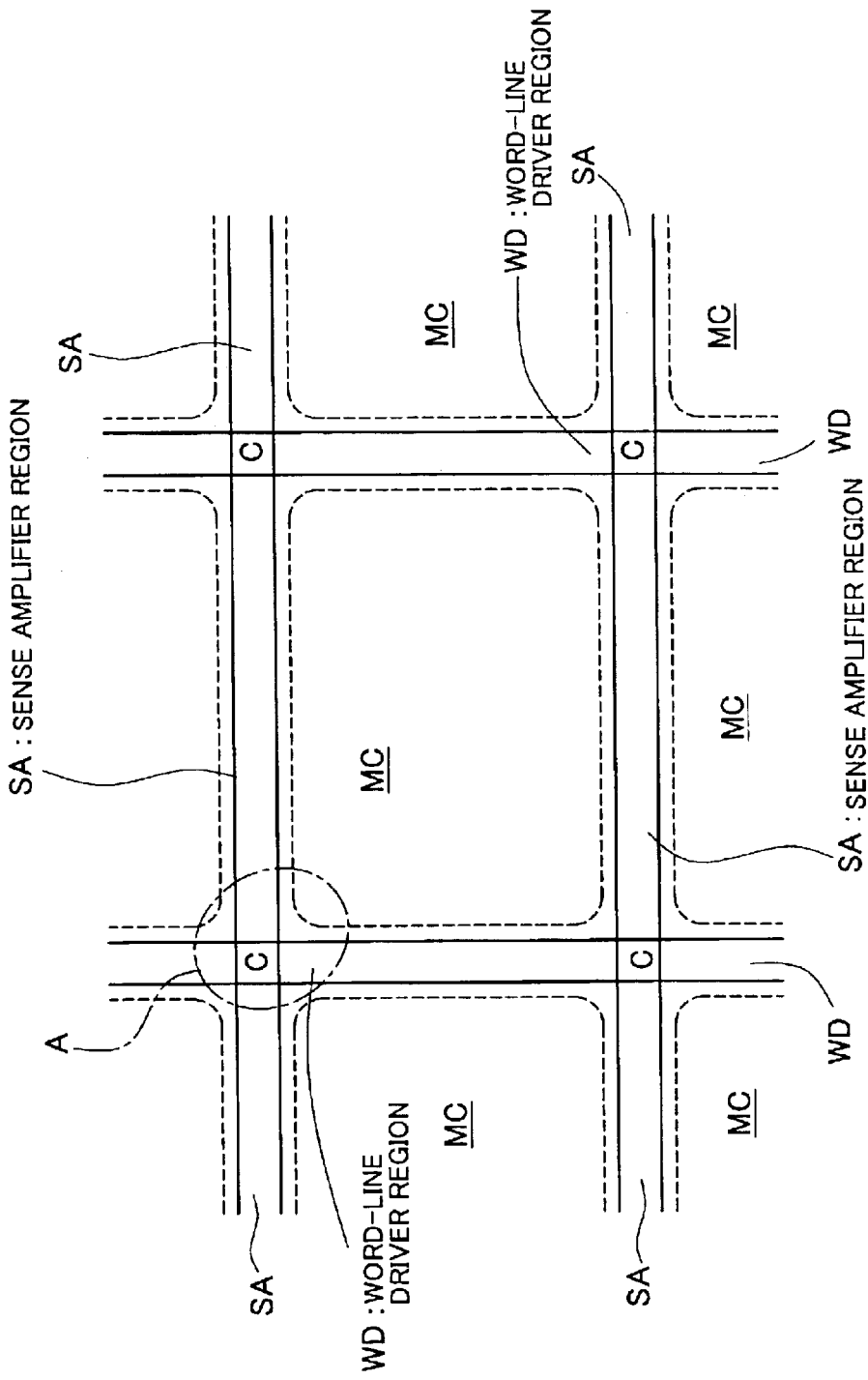
FIG. 1 is a layout diagram showing a memory cell array structure in an embodiment of the present invention.

In a layout diagram of FIG. 1, a part of a memory cell array structure of the semiconductor memory device embodying the invention is enlarged schematically. A memory cell array is formed as a memory cell array region MC for each predetermined number of bits, and a data access unit is constituted with the memory cell array region MC as an active unit. Memory cells are arranged in matrix form in the memory cell array region MC (see FIG. 2) and are differential-amplified bit line pair by bit line pair by means of sense amplifiers arranged in a sense amplifier region SA. Connection control between memory cells and bit lines is performed by plural word lines which are selected in an alternative manner by a word line driver disposed in a word line driver region WD. The plural word lines are each connection-controlled so that memory cells connected to one bit lines in plural bit line pairs are selected in common. As a result of selection of plural memory cells by one word line, one bit line in each bit line pair and each memory cell turn conductive and the sense amplifier is activated at the same time, whereby a differential amplification operation is performed.

The bit lines which are connection-controlled to memory cells and the word lines which make connection-control for the bit liens are wired perpendicularly to each other with the memory cell array region MC, so that the sense amplifier region SA in which are arranged sense amplifiers for making a differential amplification of bit line pairs and the word line driver region WD in which are arranged word line drivers for driving word lines, are arranged perpendicularly to sides of the memory cell array region MC.

In a cross region C between the sense amplifier region SA and the word line driver region WD, which is positioned at each corner portion of the memory cell array region MC, there is auxiliary disposed a driver-dedicated MOS transistor for the supply of electric power to the sense amplifiers.

Figure 2:
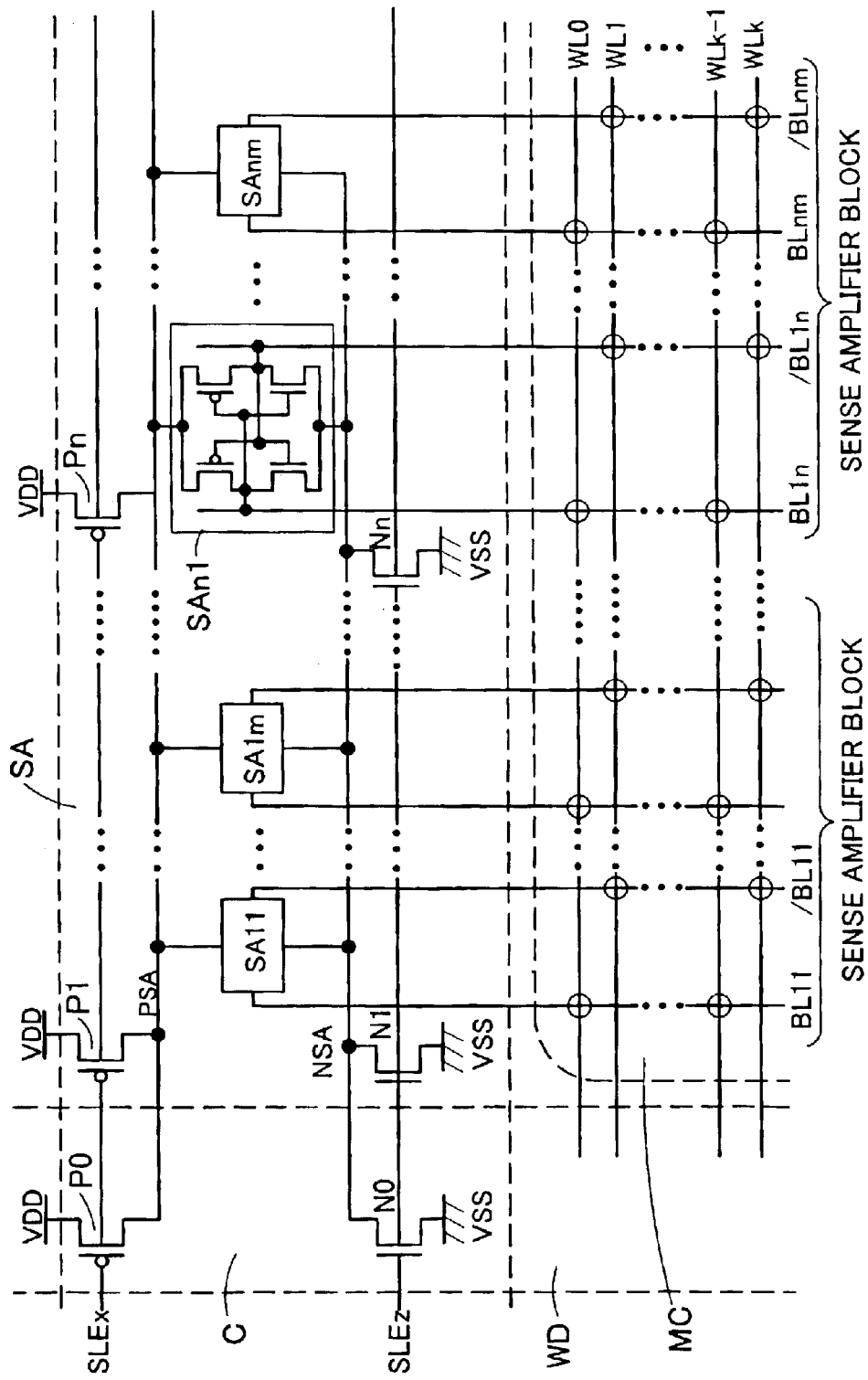
FIG. 2 is an expanded circuit diagram of region A in FIG. 1.

FIG. 2 is an expanded circuit diagram of region A in FIG. 1. In the sense amplifier region SA are arranged plural sense amplifiers SA11 to SAnm. To the sense amplifiers SA11~SAnm are respectively connected bit line pairs BL11 and /BL11 to BLnm and /BLnm which are differential-amplified. The bit line pairs BL11 and /BL11 to BLnm and /BLnm are wired from the sense amplifiers SA11~SAnm in the sense amplifier region SA toward the memory cell array MC and are conduction-controlled alternately by word lines WL0 to WLk which are wired from the word line drivers in the word line driver region WD, to connect the memory cells. In FIG. 2, small circle portions which enclose intersecting points of bit lines BL11 to /BLnm and word lines WL0 to WLk represent memory cells.

As illustrated in the sense amplifier SAn1, the sense amplifiers SA11 to SAnm have a construction wherein input and output of a CMOS inverter gate are connected with each other and are respectively connected to bit lines BLn1 and /BLn1, thereby differential-amplifying a very small voltage difference between bit lines read from memory cells. A high supply voltage line PSA and a low supply voltage line NSA of the sense amplifiers SA11 to SAnm are connected in common to those sense amplifiers and are connected respectively to a supply voltage VDD and a reference voltage VSS for each predetermined number of sense amplifiers SA11 to SA1m, . . . , SAn1 to SAnm through PMOS transistors P1 to Pn and NMOS transistors N1 to Nn which are driver-dedicated MOS transistors. The PMOS transistors P1 to Pn and the NMOS transistors N1 to Nn, which are constituted as driver-dedicated MOS transistors, are arranged in the sense amplifier region SA. Further, a sense amplifier block is constituted for each predetermined number of sense amplifiers SA11 to SA1m, . . . , SAn1 to SAnm.

Further, a PMOS transistor P0 and an NMOS transistor N0, as auxiliary driver-dedicated MOS transistors, are arranged in the cross region C and respectively provide a connection between supply voltage VDD and high supply voltage line PSA and a connection between reference voltage VSS and low supply voltage line NSA.

Gate terminals of PMOS transistors P0 to Pn are connected in common and are conduction-controlled with a gate control signal SLEx. Supply voltage VDD is connected to the high supply voltage line PSA to supply VDD to the sense amplifiers SA11~SAnm. Likewise, gate terminals of NMOS transistors N0 to Nn are connected in common and are conduction-controlled with a gate control signal SLEz. Reference voltage VSS is connected to the low supply voltage line NSA to supply VSS to the sense amplifiers SA11 to SAnm.

Figure 3:
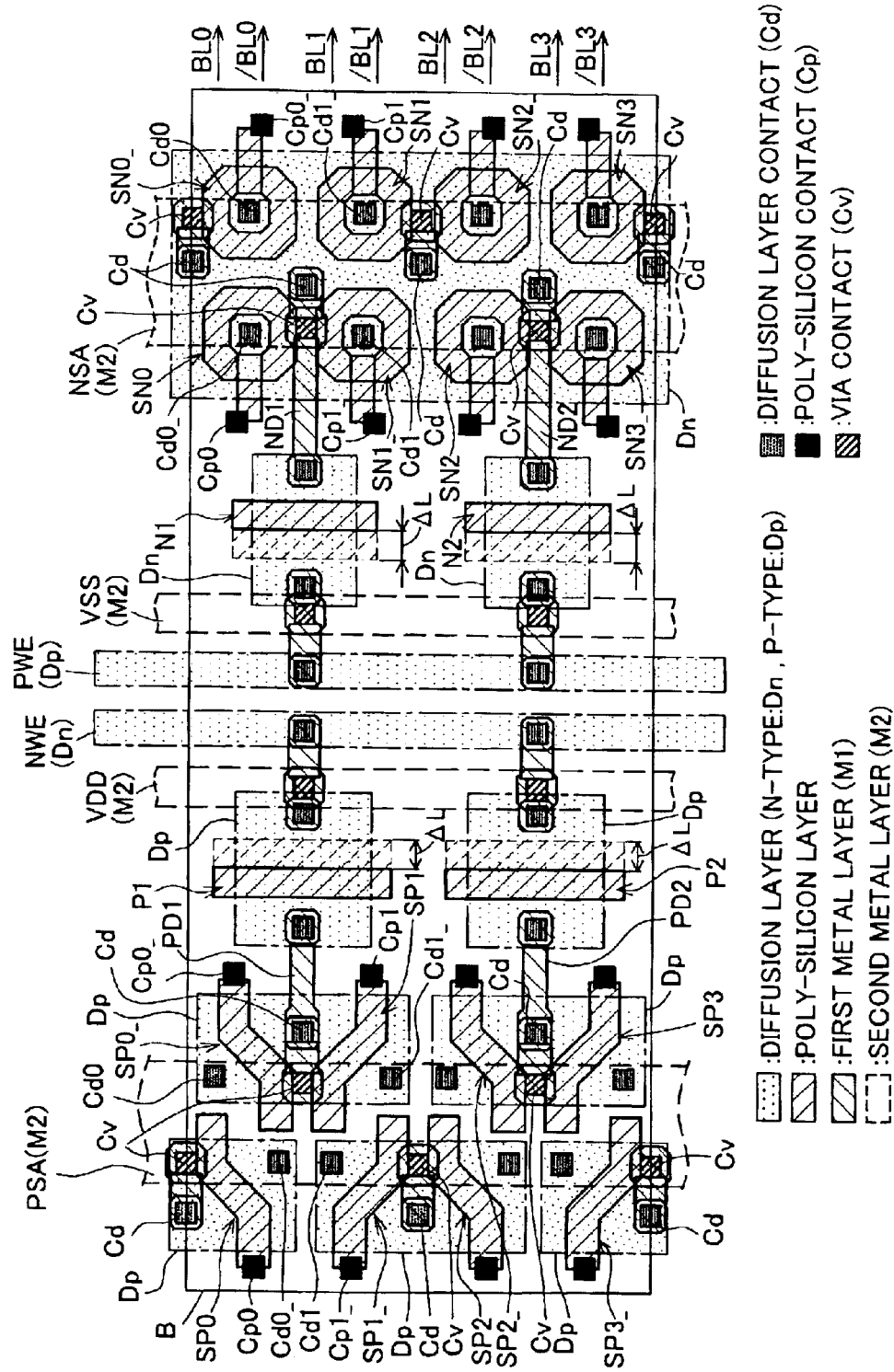
FIG. 3 is a layout example (1) of a sense amplifier region in a sense amplifier block in the embodiment.

FIG. 3 shows a layout example (1) of a sense amplifier region in a sense amplifier block in which four sets of sense amplifiers are provided. Centrally of the sense amplifier block B are arranged an N well end NWE and a P well end PWE in an opposed relation to each other, the N well end NWE being formed by an N type diffusion layer Dn for the supply of bias to N type well, the P well end PWE being formed by a P type diffusion layer Dp for the supply of bias to P type well. The left-hand side from the N well end NWE constitutes an N type well region, while the right-hand side from the p well end PWE constitutes a P type well region.

In the N type well region, P type diffusion layer Dp is formed at every two transistors using a source terminal in common and sense amplifier-dedicated PMOS transistor pairs SP0 and SP0_ to SP3 and SP3_ are arranged, further, P type diffusion layer Dp is formed for each transistor and driver-dedicated PMOS transistors P1 and P2 are arranged. In the P type well region, N type diffusion layer Dn is formed for eight transistors using a source terminal in common and sense amplifier-dedicated NMOS transistor pairs SN0 and SN0_ to SN3 and SN3_ are arranged, further, N type diffusion layer Dn is formed for each transistor and driver-dedicated NMOS transistors N1 and N2 are arranged.

Bit line pairs BL0 and /BL0 to BL3 and /BL3 (not shown) are arranged perpendicularly to the gate width direction of driver-dedicated MOS transistors P1, P2, N1, and N2 through a first metal layer for example and are connected to PMOS transistor pairs SP0 and SP0_ to SP3 and SP3_ and NMOS transistor pairs SN0 and SN0_ to SN3 and SN3_.

That is, bit line BL0 is connected to the gate terminal of PMOS transistor SP0 through contact Cp0, is connected to the drain terminal of PMOS transistor SP0_ through contact Cd0, is connected to a gate terminal of NMOS transistor SN0 through contact Cp0, and is connected to a drain terminal of NMOS transistor SN0_ through contact Cd0. Bit line /BL0 is connected through contacts Cp0_ and Cd0_ to gate terminals of PMOS transistor SP0_ and NMOS transistor SN0_ and to drain terminals of PMOS transistor SP0 and NMOS transistor SN0.

For keeping the wiring pitch of bit line pair BL0 and /BL0 to a minimum width, PMOS transistor pair SP0 and SP0_ and NMOS transistor pair SN0 and SN0_ are arranged side by side in the wiring direction of bit line pair BL0 and /BL0, whereby the minimum width of the wiring pitch between the bit line pair BL0 and /BL0 can be set within the width of one of sense amplifier-dedicated MOS transistors SP0 to SN0_.

As to adjacent bit line pair BL1 and /BL1, the layout in bit line pair BL0 and /BL0 is mirrored relative to the wiring direction of bit lines. Therefore, the sense amplifier-dedicated MOS transistors SP1, SP1_, SN1, and SN1_, which are connected to bit lines BL1 and /BL1, are positioned reverse to the case of bit lines BL0 and /BL0. Bit line BL1 is connected through contacts Cp1 and Cd1 to gate terminals of PMOS transistor SP1 and NMOS transistor SN1 and to drain terminals of PMOS transistor SP1_ and NMOS transistor SN1_. Bit line /BL1 is connected through contacts Cp1_ and Cd1_ to gate terminals of PMOS transistor SP1_ and NMOS transistor SN1_ and to drain terminals of PMOS transistor SP1 and NMOS transistor SN1.

The layout of bit line pairs BL2 and /BL2, BL3 and /BL3 is repeated with the layout of bit line pairs BL0 and /BL0, BL1 and /BL1 as one unit, both being similar in wiring and layout.

PMOS transistors P1, P2 and NMOS transistors N1, N2 are provided between sense amplifier-constituting PMOS transistors SP0, SP0_ to SP3, SP3_ and Nwell end NWE and between NMOS transistors SN0, SN0_ to SN3, SN3_ and P well end PWE in such a manner that the gate width direction is perpendicular to the wiring direction of bit lines. They are driver-dedicated MOS transistors.

PMOS transistors P1, P2 and NMOS transistors N1, N2 are arranged at every two bit line pair pitches. More specifically, PMOS transistor P1 and NMOS transistor N1 are arranged at bit line pair pitches BL0 and /BL0, BL1 and /BL1, while PMOS transistor P2 and NMOS transistor N2 are arranged at bit line pair pitches BL2 and /BL2, BL3 and /BL3. Therefor, the gate width W can be adjusted using the length of two bit line pair pitches as a maximum value.

PMOS transistors P1, P2 and NMOS transistors N1, N2 are constituted so as to have an adjusting distance ΔL that is longer than a gate length allowable in process, as a gate layout region between source and drain terminals. Thus, by only the correction of polysilicon layer it is possible to adjust the gate length and also possible to adjust the tailing current. PMOS transistors P1, P2 and NMOS transistors N1, N2 are driver-dedicated transistors and are required to possess sufficient current drivability. For this reason, as to the gate length L, there usually is adopted a method wherein a short gate length is used as a reference and is made longer in accordance with the necessity of diminishing the tailing current. Since the gate length L itself is set short, there can be obtained a satisfactory tailing current value adjusting effect even in the gate length adjusting region ΔL which is very small. FIG. 3 shows a case where there is ensured an adjusting region of a length equal to the short gate length as a reference. For example, if the short gate length is 0.3 micron, it suffices to have a gate length adjusting region ΔL of about 0.3 micron. The tailing current value greatly depends on the gate length L.

Source terminals of PMOS transistors P1, P2 and NMOS transistors N1, N2 and N and P well ends NWE, PWE are arranged facing to each other and are connected, through a first metal layer M1, using diffusion layer contact Cd and via contact Cv, to supply voltage VDD and reference voltage VSS which are wired by a second metal layer M2 running in parallel with N and P well ends NWE, PWE.

Drain terminals of PMOS transistors P1 and P2 are connected through diffusion layer contact Cd to supply voltage feed lines PD1 and PD2 which are constituted by the first metal layer M1, and are also connected through diffusion layer contact Cd to a common source terminal of PMOS transistors SP0__ and SP1 and that of SP2__ and SP3 to feed the supply voltage VDD. The drain terminals in question are further connected through via contact Cv to a high supply voltage line PSA which is constituted by the second metal layer M2, and is connected from the high supply voltage line PSA to other common source terminals through via contact Cv, first metal layer M1, and diffusion layer contact Cd to feed supply voltage VDD to PMOS transistors SP0, SP1__, and SP2, SP3__.

Drain terminals of NMOS transistors N1 and N2 are connected through diffusion layer contact Cd to reference voltage feed lines ND1 and ND2 which are constituted by the first metal layer M1, and are connected through diffusion layer contact Cd to the region surrounded with NMOS transistors SN0, SN0__, SN1, and SN1__ and the region surrounded with NMOS transistors SN2, SN2__, SN3, and SN3__, in common source terminals. The drain terminals in question are also connected through via contact Cv to a low supply voltage line NSA which is constituted by the second metal layer M2, and from the low supply voltage line NSA they are further connected through via contact Cv, first metal layer M1, and diffusion layer contact Cd to common source terminals which are not directly connected by the reference voltage feed lines ND1 and ND2. More specifically, they are connected to the region surrounded with NMOS transistors SN0, SN0__ and an end portion of the sense amplifier block B, the region surrounded with NMOS transistors SN1, SN1__, SN2, and SN2__, and the region surrounded with NMOS transistors SN3, SN3__ and an end portion of the sense amplifier block B. Through these connections a uniform reference voltage VSS is fed to the common source terminals.

The wiring direction of the second metal layer M2 which constitutes the high and low supply voltage lines PSA, NSA is orthogonal to the wiring direction of bit line pairs and the second metal layer is connected in common to source terminals of PMOS transistors SP0, SP0__ to SP3, SP3__ and NMOS transistors SN0, SN0__ to SN3, SN3.

According to the layout example (1) of the sense amplifier shown in FIG. 3, in order to feed supply voltage VDD and reference voltage VSS with sufficient supply capability to sense amplifiers SP0, SP0__ and SN0, S0__ to SP3, SP3__ and SN3, SN3__, the driver-dedicated MOS transistors P1 and N1, P2 and N2 usually have a long gate width W relative to a short gate length L. The long gate width W can be adjusted freely without being restricted by the wiring pitch in a direction orthogonal to the wiring direction of bit line pairs BL0 and /BL0 to BL3 and /BL3 in the sense amplifier region SA and thus a sufficient gate width W can be ensured. As to the gate length L, since the standard gate length size itself is very short, it can be adjusted sufficiently in a very small length adjusting region. Also in a direction parallel to the wiring direction of bit line pairs in which the adjusting region is restricted due to a layout restriction of adjacent elements in the sense amplifier region SA, there can be obtained a gate length L for which a sufficient adjusting region is ensured. Both gate width W and gate length L can be adjusted with a sufficient degree of freedom and it becomes possible to provide a driver-dedicated MOS transistor of an appropriately adjusted size with respect to such characteristics contrary to each other as ensuring sufficient current supply capability and diminishing the tailing current. Although in FIG. 3 the gate length adjusting region ΔL is disposed on the source side, it may be disposed on the drain side. In this case, the drivability of the driver-dedicated MOS transistor is further improved.

The power supply path from the drain terminals of driver-dedicated MOS transistors P1, P2 and N1, N2 to the source terminals as power terminals of sense amplifier-dedicated transistors SP0, SP0__ to SP3, SP3__, and SN0, SN0__ to SN3, SN3__ is wired by a low resistance wiring layer including power voltage feed lines PD1, PD2 and reference voltage feed lines ND1, ND2, which are constituted by the first metal layer M1, and high supply voltage line PSA and low supply voltage line NSA which are constituted by the second metal layer M2. Consequently, there occurs only a slight voltage drop in the wiring path and supply voltage VDD and reference voltage VSS can be fed positively to each sense amplifier-dedicated transistor. Although four sense amplifier transistors are arranged for each of driver-dedicated MOS transistors P1, P2, N1, and N2, a voltage drop on the power supply path between sense amplifiers becomes uniform and hence the power supply capability to each sense amplifier transistor is balanced.

Moreover, since the driver-dedicated MOS transistors P1, P2, N1, and N2 are beforehand provided with the gate length adjusting region ΔL of gate length L, the gate length L can be adjusted by only adjusting the polysilicon layer which is a gate layer. In manufacturing the semiconductor memory device, the current supply capability of driver-dedicated MOS transistors P1, P2, N1, N2 and the tailing current can be adjusted by the correction of only the photomask of polysilicon layer, thus permitting reduction of the adjusting time and cost.

If the layout example (1) of the sense amplifier region shown in FIG. 3 is applied to the circuit configuration of FIG. 2, the driver-dedicated MOS transistors P1 and N1, P2 and N2, are arranged dispersively in the sense amplifier region SA at every two sets of bit line pairs BL0, /BL0 and BL1, /BL1, and BL2, /BL2 and BL3, /BL3 which are two sets of sense amplifiers. Therefore, the wiring load on the power to each sense amplifier can be diminished. In addition, as shown in FIG. 3, since the power supply path comprises the first and second metal layers M1, M2, the wiring load can be greatly diminished. Since the power supply capability to each sense amplifier becomes uniform and the voltage drop on the path is very small, the supply voltage VDD and reference voltage VSS can be fed effectively even with the driver-dedicated MOS transistors P1 and N1, P2 and N2, which are small in gate width W.

In the case where driver-dedicated MOS transistors are arranged in a concentrated fashion, it is necessary to ensure a predetermined operating speed even for the sense amplifier located at a remotest point at which the wiring load is maximum, so that it is necessary to use a driver-dedicated MOS transistor having a very large gate width W and possessing a high current drivability. On the other hand, in the case where the circuit configuration of FIG. 2 is implemented by the layout of FIG. 3, even in the use of a driver-dedicated MOS transistor with suppressed overall gate width W and smaller current drivability, all the sense amplifiers can be made high in speed because the wiring load is decreased by the dispersive arrangement and further because the wiring path is wired by the first and second metal layers M1, M2 which are low resistance wiring layers, with consequent decrease of load. By improving the layout structure, in addition to the dispersive arrangement, it is possible to realize a high-speed operation with a shorter gate width W and suppressed variations in time delay in an amplifying operation between sense amplifiers.

Besides, since electric power is fed also from the auxiliary driver-dedicated MOS transistors P0 and N0, the total current drivability of driver-dedicated MOS transistors P1, P2, N1, and N2 can be made so much small and the overall gate width W can be shortened. The layout region of driver-dedicated MOS transistors P1, P2, N1, and N2 in the sense amplifier region SA can be made small, so that not only the layout freedom in the pitch direction of bit line pairs BL0 and /BL0 to BL3 and /BL3 can be improved, but also the tailing current can be diminished.

Further, since the auxiliary driver-dedicated MOS transistors P0 and N0 are arranged in the cross region C, it is no longer required to ensure a layout region of the auxiliary driver-dedicated MOS transistors P0 and N0 in the sense amplifier region SA, whereby it is possible to ensure a sufficient region for adjusting the gate width W and gate length L of the driver-dedicated MOS transistor disposed in the sense amplifier region SA and thus the freedom of adjustment can be improved. Additionally, since the auxiliary driver-dedicated MOS transistors P0 and N0 are not arranged in the sense amplifier region SA, it is possible to compress the layout region of the sense amplifier region SA.

Figure 4:
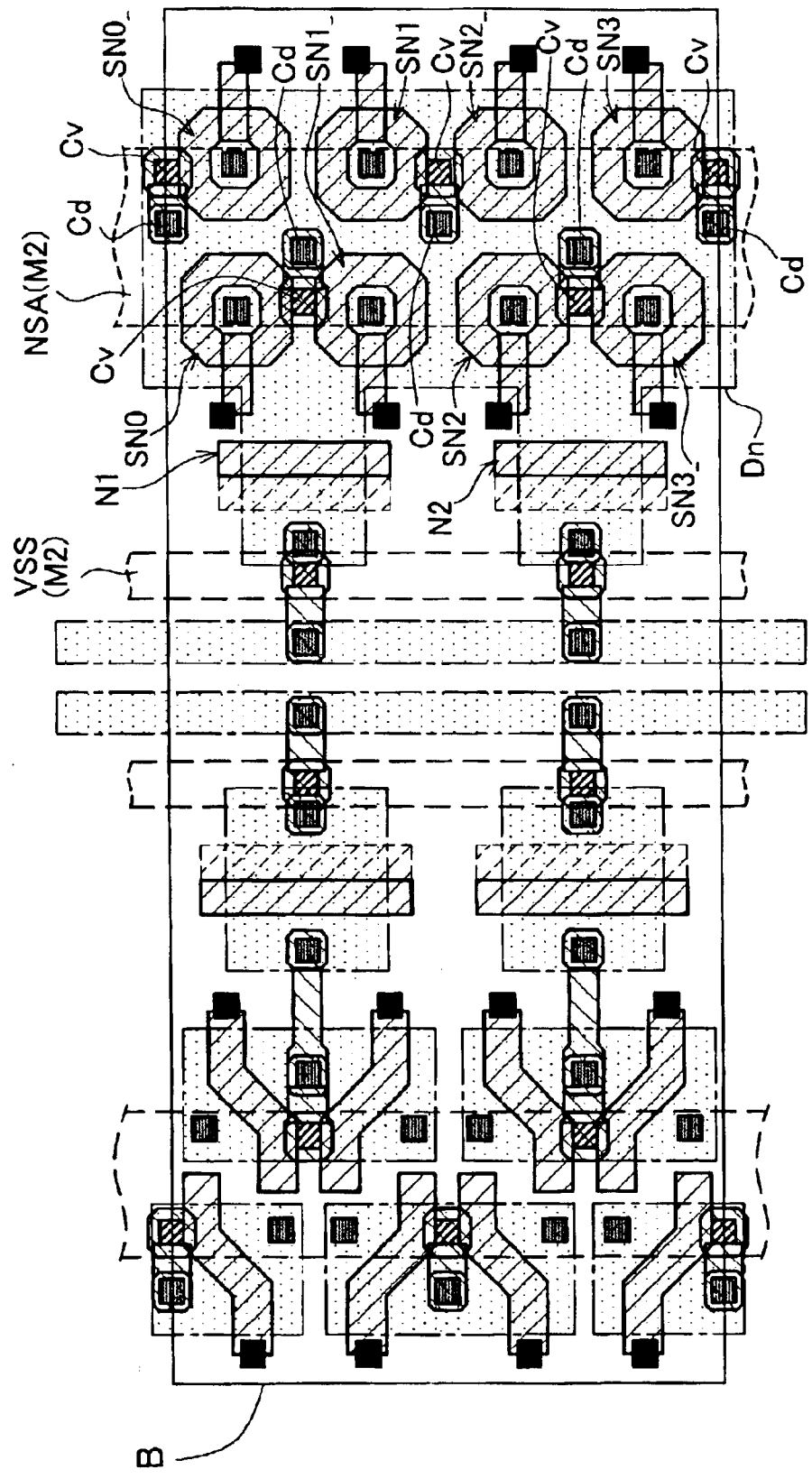
FIG. 4 is a layout example (2) of a sense amplifier region in a sense amplifier block in the embodiment.

FIG. 4 shows a layout example (2) of the sense amplifier region in a construction where four sets of sense amplifiers are provided in the sense amplifier block B. Instead of the reference voltage feed lines ND1 and ND2 in the layout example (1) of FIG. 3, the diffusion layer Dn which constitutes the drain terminals of driver-dedicated NMOS transistors N1, N2 and the diffusion layer Dn which constitutes a common source terminal of sense amplifier-dedicated NMOS transistors SN0, SN0_ to SN3, SN3_ are connected directly by the diffusion layer Dn.

As a result, it becomes unnecessary to dispose the diffusion layer contact Cd for connecting the drain terminals of driver-dedicated NMOS transistors N1 and N2 to the first metal layer M1, and the driver-dedicated NMOS transistors N1, N2 and the sense amplifier-dedicated NMOS transistors SN0, SN0_ to SN3, SN3_ can be arranged so much closer to each other. Since connection can be effected at a short distance, not only it is possible to compress the layout region but also it is possible to suppress a voltage drop in the power supply path extending from the driver-dedicated MOS transistors N1, N2 to the sense amplifier-dedicated NMOS transistors SN0, SN0_ to SN3, SN3_.

At the same time, the second metal layer M2 which constitutes the low supply voltage line NSA is connected at every bit line pair pitch to a common source terminal of the sense amplifier-dedicated NMOS transistors SN0, SN0_ to SN3, SN3_ perpendicularly to the wiring direction of bit line pairs. Consequently, the reference voltage VSS, which is fed from the driver-dedicated NMOS transistors N1 and N2 through the diffusion layer Dn, comes to be connected by the low resistance wiring layer through the auxiliary path of the second metal layer M2 at the common source terminal of sense amplifier-dedicated NMOS transistors SN0, SN0_ to SN3, SN3_, whereby the load on the feed path of the reference voltage VSS to NMOS transistors SN0, SN0_ to SN3, SN3_ is balanced.

FIG. 4 shows an example in which the spacing between driver-dedicated NMOS transistors N1, N2 and sense amplifier-dedicated NMOS transistors SN0, SN0_ to SN3, SN3_ is defined by the spacing between their gate terminals. The spacing between both transistors can be further shortened for example by changing the shape of the gate terminals of sense amplifier-dedicated NMOS transistors SN0, SN0_ to SN3, SN3_, and thus it is possible to compress the sense amplifier region SA.

Although in FIG. 4 the driver-dedicated PMOS transistors P1, P2 and the sense amplifier-dedicated PMOS transistors SP0, SP0_ to SP3, SP3_ are not directly connected by the diffusion layer Dp, it goes without saying that a direct coupling can be made by making some improvement to the layout structure.

According to the layout example (2) of the sense amplifier region in FIG. 4, as is the case with FIG. 3, the gate width W and length L of the driver-dedicated MOS transistors P1, P2 and N1, N2 can be adjusted with a sufficient degree of freedom and it is possible to provide a driver-dedicated MOS transistor of an appropriately adjusted size with respect to such characteristics contrary to each other as ensuring sufficient current supply capability and diminishing the tailing current.

Additionally, the source terminals of the driver-dedicated NMOS transistors N1, N2 and the common source terminal as a power terminal of the sense amplifier-dedicated NMOS transistors SN0, SN0_ to SN3, SN3_ can be connected at a short distance, thus permitting compression of the sense amplifier region SA, and it is possible to suppress a voltage drop in the power supply path extending from the driver-dedicated MOS transistors N1, N2 to the sense amplifier-dedicated NMOS transistors. At the same time, since the low supply voltage line NSA is formed as an auxiliary path by the second metal layer M2 which is a low resistance wiring layer, the supply of the reference voltage VSS is balanced and variations in operation of the sense amplifier-dedicated NMOS transistors SP0, SP0_ to SP3, SP3_ are diminished.

As to functions and effects obtained by applying the layout example (2) of the sense amplifier region in FIG. 4 to the circuit configuration of FIG. 2, they are the same as in FIG. 3, so an explanation thereof will here be omitted.

Figure 5:
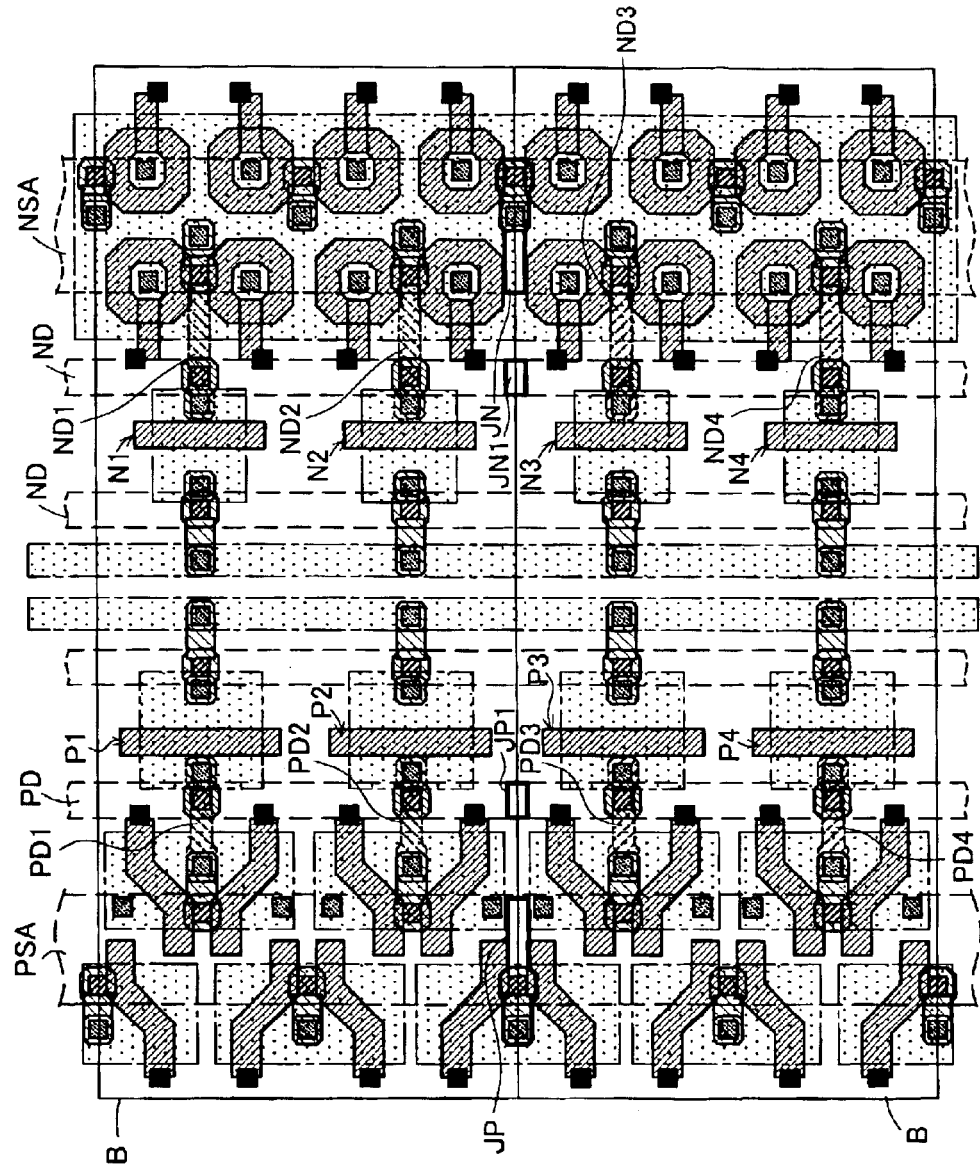
FIG. 5 is a layout example of a sense amplifier region in continuous sense amplifier blocks in the embodiment.

FIG. 5 shows a layout example of the sense amplifier region in which two sets of sense amplifier blocks B are arranged continuously. In a connection between the sense amplifier blocks B, the high supply voltage line PSA and the low supply voltage line NSA are connected by the second metal layer M2 (a connection JP in the high supply voltage line PSA and a connection JN in the low supply voltage line NSA). Consequently, the source terminals of sense amplifier-dedicated MOS transistors and those of NMOS transistors between the sense amplifier blocks B are connected in common with the second metal layer M2 of a low resistance and the loads from the high and low supply voltage lines PSA, NSA to the source terminals become equal between the sense amplifier blocks B.

Therefore, the supply voltage feed lines PD1 to PD4 and the reference voltage feed lines ND1 to ND4, which are arranged for each sense amplifier block B and which are connected from the driver-dedicated PMOS transistors P1 to P4 and NMOS transistors N1 to N4 to the high supply voltage line PSA and low supply voltage line NSA, can be thinned out appropriately, whereby the overall gate width W of driver-dedicated MOS transistors can be adjusted to adjust the current supply capability and hence the overall tailing current which largely depends on the overall gate width W can be adjusted. For example, the current supply capability can be made to half by separating the supply voltage feed lines PD2, PD4 and reference voltage feed lines ND2, ND4. In this case, the supply of the supply voltage VDD and reference voltage VSS to the sense amplifier-dedicated transistors in the sense amplifier block B is conducted by the driver-dedicated transistors P1, P3, N1, and N3 arranged in the other sense amplifier block B or by the auxiliary driver-dedicated transistors in addition to the driver-dedicated transistors P1, P3, N1, and N3, through the high and low supply voltage lines PSA, NSA.

Since the high and low supply voltage lines PSA, NSA are wired by the second metal layer M2 of a low resistance, it is possible to ignore the difference of power supply paths between the sense amplifier blocks B. By adjusting connection and non-connection of individual driver-dedicated MOS transistors it is possible to appropriately adjust such characteristics contrary to each other as ensuring sufficient current supply capability and diminishing the tailing current.

The drain terminals of the driver-dedicated MOS transistors P1 to P4 and the drain terminals of the driver-dedicated MOS transistors N1 to N4 can be connected together by second metal layers PD and ND which are low resistance wiring layers. Also in this case, in the connection between sense amplifier blocks B, the connection is made by a connection JP1 for the second metal layer PD and by a connection JN1 for the second metal layer ND. As a result, the drain terminals of driver-dedicated MOS transistors P1 to P4 and the drain terminals of driver-dedicated MOS transistors N1 to N4 are respectively connected in common and the supply path loads of the supply voltage VDD and reference voltage VSS for sense amplifier-dedicated transistors become equal between the sense amplifier blocks B.

Thinning-out of driver-dedicated MOS transistors P1 to P4 and N1 to N4 can be done by connection or non-connection of the supply voltage feed lines PD1 to PD4 and the reference voltage feed liens ND1 to ND4 or by arrangement or non-arrangement of the first metal layer M1 which constitutes those feed lines, further, it can also be done by arrangement or non-arrangement of diffusion layer contacts Cd of source and drain terminals in the driver-dedicated MOS transistors P1 to P4 and N1 to N4. In case of wiring the second metal layers PD and ND, the thinning-out in question can be done by arrangement or non-arrangement of diffusion layer contacts Cd of drain terminals in the driver-dedicated MOS transistors P1 to P4 and N1 to N4. Further, it can be done by connection or non-connection between source terminals and power line VDD or VSS instead of connection or non-connection of the supply voltage feed lines PD1 to PD4 and reference voltage feed lines ND1 to ND4. These methods are also applicable to the layout example of FIG. 4. Further, in FIG. 4, the thinning-out in question can be done by arrangement or non-arrangement of the connection of diffusion layer Dn which is connected directly.

Connection and disconnection of individual driver-dedicated MOS transistors P1 to P4 and N1 to N4 can be done by correcting only the photomask of either the diffusion layer contact Cd or the first metal layer M1 as the second low resistance wiring layer. It is possible to reduce the adjusting time and cost at the time of adjusting the current supply capability of the driver-dedicated MOS transistors P1 to P4 and N1 to N4 and the tailing current.

As to functions and effects obtained by applying the layout example of the sense amplifier region in FIG. 5 to the circuit configuration of FIG. 2, they are the same as in FIG. 3, so an explanation thereof will here be omitted.

Figure 6:
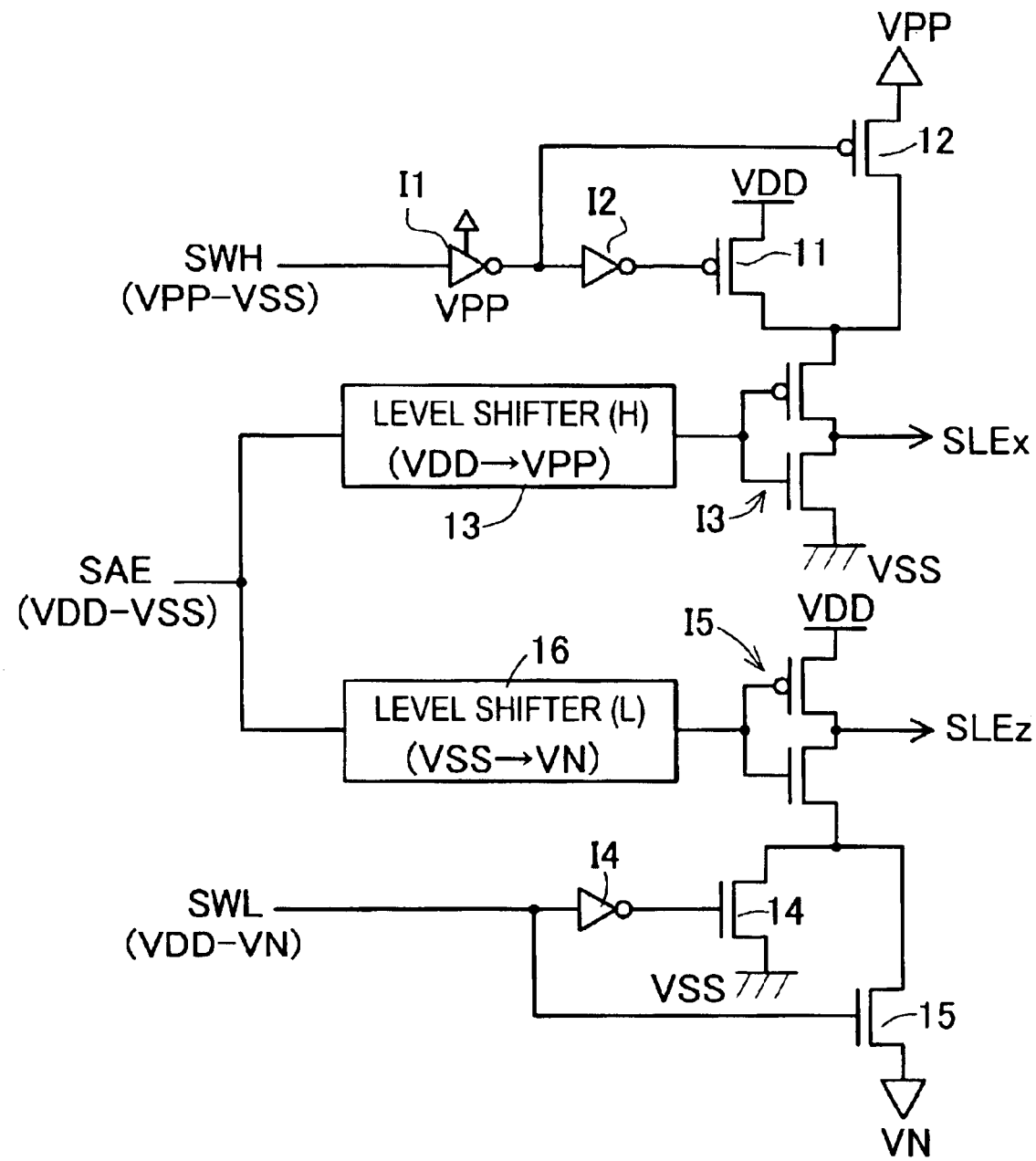
FIG. 6 is a circuit diagram showing a control circuit for a driver-dedicated MOS transistor in the embodiment.

FIG. 6 shows a control circuit which outputs gate control signals SLEx and SLEz for the driver-dedicated MOS transistors P0 to Pn and N0 to Nn in FIG. 2. This control circuit has a function of deeply reverse-biasing the gate bias when the driver-dedicated MOS transistors are OFF in order to suppress the tailing current.

A sense amplifier activating signal SAE of a positive logic having an amplitude voltage between the supply voltage VDD and the reference voltage VSS is inputted to a level shifter (H) 13 which steps up the supply voltage VDD up to a boosting voltage VPP and is also inputted a level shifter (L) 16 which steps down the reference voltage VSS to a negative voltage VN. The sense amplifier activating signals SAE level-shifted by the level shifters (H) 13 and (L) 16 are fed to inverter gates 13 and 15, respectively, which in turn provide a gate control signal SLEx for the driver-dedicated PMOS transistors P0 to Pn and a gate control signal SLEz for the driver-dedicated NMOS transistors N0 to Nn.

With sense amplifiers activated, the gate control signals SLEx and SLEz assume a reference voltage VSS level and a supply voltage VDD level, respectively. In this case, NMOS and PMOS transistors of the inverter gates turn conductive.

With sense amplifiers inactivated, the logic level reverses and PMOS and NMOS transistors of the inverter gates 13 and 15 turn conductive. The transistors which set a logic level voltage at this time are the PMOS transistor 11 connected to the supply voltage VDD, PMOS transistor 12 connected to the boosting voltage VPP, NMOS transistor connected to the reference voltage VSS, and NMOS transistor 15 connected to the negative voltage VN.

A PMOS tailing current extinction signal SWH of a positive logic having an amplitude voltage between the boosting voltage VPP and the reference voltage VSS is connected to the gate terminal of PMOS transistor 11 through the inverter gates I1 and I2, while to the gate terminal of PMOS transistor 12 is connected the PMOS current extinction signal SWH through the inverter gate I1. The supply voltage of the inverter gate I1 is the boosting voltage VPP.

An NMOS tailing current extinction signal SWL of a positive logic having an amplitude voltage between the supply voltage VDD and the negative voltage VN is connected to the gate terminal of NMOS transistor I4, while to the gate terminal of NMOS transistor 15 is connected the NMOS tailing current extinction signal SWL directly.

In an operational state in which a shift to a sense amplifier activating operation is performed immediately such as an ordinary stand-by state, in a normal operation mode permitting acceptance of an external access at all times, or in the case where it is not necessary to diminish the tailing current, the voltage level of the PMOS tailing current extinction signal SWH is set at the reference voltage VSS, while the voltage level of the NMOS tailing current extinction signal SWL is set at the negative voltage VN. PMOS transistor 12 and NMOS transistor 15 are turned OFF, while PMOS transistor 11 and NMOS transistor 14 are turned ON. Signal levels which indicates an inactive state of the gate control signals SLEx and SLEz become high and low, respectively, of supply voltage VDD and reference voltage VSS, and in a state in which the voltage difference of gate terminal relative to source terminal is 0V as in the ordinary logic circuit, the driver-dedicated MOS transistors P0 to Pn, N0 to Nn, turn OFF.

When it is known that a sense amplifier activating operation is not performed for a certain time, or when a shift to the sense amplifier activating operation is not conducted immediately, or when a shift timing to the activating operation is known in advance, as typified by power down mode, nap mode, any other power saving mode, or self-refresh mode, if it is necessary to diminish the tailing current, the voltage level of the PMOS tailing current diminishing signal SWH is set to the boosting voltage VPP and that of the NMOS tailing current diminishing signal SWL is set to the supply voltage VDD. The nap mode as referred to herein means an operation mode in which refreshing operation is not performed while an internal power supply is held in an active state, for example in DRAM. In this operation mode, it is possible to accept an external instruction while held data are not guaranteed, and an access operation can be executed upon receipt of an external instruction.

PMOS transistor 11 and NMOS transistor 14 are turned OFF, while PMOS transistor 12 and NMOS transistor 15 are turned ON. Signal levels which indicate an inactive state of the gate control signals SLEx and SLEz become high and low levels of the boosting voltage VPP and negative voltage VN, respectively. A further reverse bias is applied from an OFF-state bias in the ordinary logic circuit and a voltage difference of gate terminal relative to source terminal is biased to a positive voltage (=VPP−VDD) in the driver-dedicated PMOS transistors P0 t Pn, while it is biased to a negative voltage (=−VN) in the driver-dedicated NMOS transistors N0 to Nn, thus turning OFF both transistors positively and diminishing the tailing current in OFF state.

Figure 7:
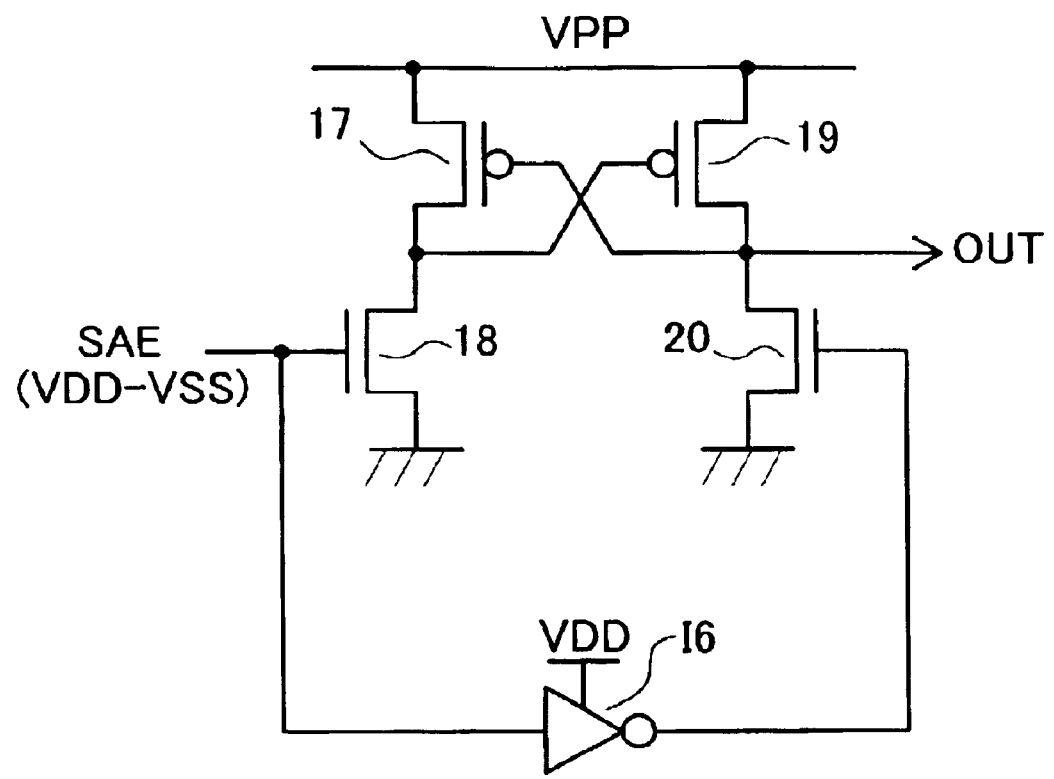
FIG. 7 is a circuit diagram showing a specific example of a level shifter illustrated in FIG. 6.

FIG. 7 shows a specific example of the level shifter (H) 13. This example is a circuit example in which the sense amplifier activating signal SAE having a voltage amplitude between the supply voltage VDD and the reference voltage VSS is level-shifted to a signal OUT having a voltage amplitude between the boosting voltage VPP and the reference voltage VSS.

It is here assumed that a high level signal having the voltage level of the supply voltage VDD is inputted as the sense amplifier activating signal SAE. The sense amplifier activating signal SAE is inputted to a gate terminal of an NMOS transistor 18 and is also inputted to an inverter gate I6. With input of the high-level sense amplifier activating signal SAE, the NMOS transistor 18 turns conductive, applying reference voltage VSS to a gate terminal of a PMOS transistor 19, which in turn turns conductive. Further, a low level signal which has been logic-inverted by the inverter gate I6 is inputted to a gate terminal of an NMOS transistor 20, which ceases to conduct. Thus, the boosting voltage VPP is applied to the signal OUT via PMOS transistor 19 and the voltage level is shifted from the supply voltage VDD to the boosting voltage VPP. The signal OUT is inputted to a gate terminal of a PMOS transistor 17, which ceases to conduct, so that the path from the boosting voltage VPP to the gate terminal of PMOS transistor 19 is cut off.

It is assumed that a low level signal of the reference voltage VSS is inputted as the sense amplifier activating signal SAE. In this case, the NMOS transistor 18 ceases to conduct and the path for application of the reference voltage VSS to the gate terminal of the PMOS transistor 19 is cut off. On the other hand, a high level signal which has been logic-inverted by the inverter gate I6 is inputted to the gate terminal of NMOS transistor 20, which therefore turns conductive. Reference voltage VSS is applied to the signal OUT via NMOS transistor 20. Since the signal OUT is applied to the gate terminal of the PMOS transistor 17, the PMOS transistor 17 turns conductive and the boosting voltage VPP is applied to the gate terminal of the PMOS transistor 19, which in turn is held in a non-conductive state. Preferably, in FIG. 6, PMOS transistors 11, 12 and NMOS transistors 14, 15 are arranged in the cross region C in FIG. 1 together with inverters 13 and 15, while the level shifters 13 and 16 are arranged in a peripheral region which is an ordinary region other than the memory cell array region MC and regions adjacent thereto and in which many ordinary logic circuits are arranged such as a circuit (not shown) for producing the sense amplifier activating signal SAE, which arrangement is effective in suppressing an increase of die size because the occupancy area of the cross region C can be suppressed in comparison with the arrangement in the cross region.

FIG. 8 shows a case where the boosting voltage VPP used in the control circuit shown in FIG. 6 for example is made equal to the boosting voltage VPP used in activation of the word line WL. A boosting voltage VPP from a VPP generator 21 which supplies the boosting voltage VPP to a word line driver 22, can be shared in the control circuit shown in FIG. 6 for example. In FIG. 9 there is shown a case where a negative voltage VN used in the control circuit shown in FIG. 6 for example is made equal to the negative voltage VN used in inactivation of the word line WL, or a case where the negative voltage VN in question is made equal to a back gate bias VN to a p-type well layer 25, or a case where it is made equal to both. A negative voltage VN from a VN generator 23 which supplies the negative voltage VN can be shared in the control circuit shown in FIG. 6 for example.

According to an OFF-state gate voltage control to the driver-dedicated transistors P0 to Pn, N0 to Nn, shown in FIGS. 6 to 9, the driver-dedicated MOS transistors can be reverse-biased more deeply and the tailing current can be suppressed. By selecting a suitable OFF-state reverse-bias condition it is possible to diminish the tailing current in OFF state freely while ensuring a large gate width W and sufficient ON-state current drivability. The adjustment for diminishing the tailing current can be made freely beyond the trade-off relation between ensuring sufficient current drivability and diminishing the tailing current in the adjustment of gate width W and gate length L of the driver-dedicated MOS transistors.

By utilizing an output voltage of the VPP generator 21 which boosts the word line WL at the time of activation of the word line, or an output voltage of the VN generator 23 which makes the word line WL negative in voltage at the time of inactivation of the word line, or an output voltage of the VN generator 23 which applies a back gate bias to the P-type well layer 25, there accrues a convenience because it is not necessary newly provide a circuit for generating the boosting voltage VPP or negative voltage VN to turn OFF the driver-dedicated MOS transistors.

Although in FIGS. 8 and 9 reference has been made to the case where the boosting voltage VPP outputted from the VPP generator 21 or the negative voltage VN outputted from the VN generator 23 is used as it is as an OFF-state gate bias of the driver-dedicated MOS transistors, the present invention is not limited thereto, but it goes without saying that the voltage outputted from the VPP generator 21 or VN generator 23 may be divided suitably or may be further stepped up or down for use.

In the case where there is used an internal step-down voltage generating circuit for the supply of an internal supply voltage stepped down from an external supply voltage to an internal circuit, the VPP generator may be substituted by the external supply voltage, or the external supply voltage may be suitably divided or stepped up within a high voltage range in comparison with the internal supply voltage.

In the case where the bias control in OFF state of the driver-dedicated MOS transistors in FIGS. 6 to 9 is applied to the circuit configuration of FIG. 2, there can be obtained the same functions and effects as in the case of FIG. 3; besides, since the gate width W and gate length L of the driver-dedicated MOS transistors can be changed more freely, it is possible to further compress the layout region of dispersively arranged driver-dedicated MOS transistors and the layout region of auxiliary driver-dedicated MOS transistors arranged in the cross region C. The functions and effects based on the circuit configuration of FIG. 2 can be more enhanced.

Conversely to the case of FIG. 6, it is also effective to forward-bias the gate bias in ON state of driver-dedicated MOS transistors P0 to Pn, N0 to N0 more deeply. By so doing, sufficient current drivability can be ensured at a small gate width W. Since the gate width W is small, it is possible to ensure sufficient current drivability in ON state while the tailing current in OFF state is suppressed.

In FIG. 6, PMOS transistors 11 and 12 are connected to the source terminal of PMOS transistor which constitutes the inverter gate I5 instead of inverter gate I3, and NMOS transistors 14 and 15 are connected to the source terminal of NMOS transistor which constitutes the inverter gate I3 instead of inverter gate I5. Further, a PMOS drive enhancing signal SWH and an NMOS drive enhancing signal SWL, which are of a positive logic, are inputted instead of PMOS tailing current extinction signal SWH and NMOS tailing current extinction signal SWL.

As a result, PMOS drive enhancing signal SWH and NMOS drive enhancing signal SWL become high level, and if a drive enhancing state is set in the driver-dedicated MOS transistors, PMOS transistor 11 and NMOS transistor 14 are turned OFF, while PMOS transistor 12 and NMOS transistor 15 are turned ON. The negative voltage VN is applied to the gate terminals of driver-dedicated PMOS transistors P0 to Pn, while the boosting voltage VPP is applied to the gate terminals of driver-dedicated NMOS transistors N0 to Nn, whereby the current drivability of each transistor is enhanced.

As to the supply of the boosting voltage VPP and negative voltage V, it goes without saying that variations are applicable as in the case of OFF-state reverse bias enhancement shown in FIG. 6. Both OFF-state reverse-bias enhancement and ON-state forward bias enhancement may also be applied. Irrespective of the gate width W of driver-dedicated MOS transistor, sufficient current drivability and sufficient reduction of the tailing current can be attained.

FIG. 10 shows a tailing characteristic of a MOS transistor. In the case of a MOS transistor, there flows in a subthreshold region a drain current IDS in proportion of $10^{(VGS-VT)}$ and relative to gate-source voltage VGS and threshold voltage VT, as shown in (EXPRESSION ①) in FIG. 10. It is (EXPRESSION ②) that results from substitution of the ordinary OFF-state VGS=0V into (EXPRESSION ①). Even in OFF bias state of VGS=0V, there flows a current proportional to $10^{-VT}$ due to subthreshold characteristic. This current corresponds to what is called a tailing current IL.

For diminishing the tailing current IL, as is apparent also from (EXPRESSION ②), it is effective to deepen the threshold voltage VT of the MOS transistor. This state is shown in FIG. 10. It is seen from the same figure that the tailing current IL diminishes from IL=IL0 to IL=IL1 as the threshold voltage VT deepens from VT=VT0 to VT=VT1.

In case of applying the above characteristic to a driver-dedicated MOS transistor, it is required that the threshold voltage of a sense amplifier-dedicated MOS transistor be set shallow while deepening the threshold voltage of the driver-dedicated MOS transistor. This is because in an initial stage of differential amplification by a sense amplifier it is necessary to ensure sufficient current drivability even when the bit line voltage is an intermediate voltage and when the gate-source voltage of the sense amplifier-dedicated MOS transistor is insufficient. Various methods are shown in FIGS. 11 to 13. Although FIGS. 11 to 13 are directed to an NMOS transistor, it goes without saying that those methods are also applicable to a PMOS transistor.

According to the method shown in FIG. 11, a sense amplifier-dedicated MOS transistor and a driver-dedicated MOS transistor are arranged in the same P-type well region 31 and an impurity is introduced at different concentrations selectively into a channel region 32 of the driver-dedicated MOS transistor to deepen the threshold voltage of the driver-dedicated MOS transistor. Generally, the threshold voltage of a MOS transistor depends on the impurity concentration of the channel region 32, so by increasing the impurity concentration in the region 32 selectively, the threshold voltage can be set deep selectively.

According to the method shown in FIG. 12, a sense amplifier-dedicated MOS transistor and a driver-dedicated MOS transistor are arranged in p-type well layers 31 and 33, respectively, which are different in impurity concentration. In this case, the impurity concentration of the P-type well layer 33 is set higher than that of the P-type well layer 31. As in the case of FIG. 11, the impurity concentration in the channel region of the driver-dedicated MOS transistor becomes higher than that of the sense amplifier-dedicated MOS transistor and therefore the threshold voltage of the driver-dedicated MOS transistor can be deepened selectively.

According to the method shown in FIG. 13, a sense amplifier-dedicated MOS transistor and a driver-dedicated MOS transistor are arranged in P-type well layers 31 which are the same in concentration and which are arranged in different regions. In this case, the well bias of the P-type well layer 31 with the driver-dedicated MOS transistor disposed therein is made a negative voltage VN into a reverse bias deeper than the reference voltage VSS which is the well bias of the P-type well layer 31 with the sense amplifier-dedicated MOS transistor disposed therein. Generally, the threshold voltage of a MOS transistor varies depending on a back gate bias which is the well bias, and it becomes deeper as the back gate bias becomes deeper in reverse bias. By making the well bias of the P-type well layer 31 with the driver-dedicated MOS transistor disposed therein into the negative voltage VN, the threshold voltage can be made deep selectively.

According to the methods shown in FIGS. 11 to 13 it is possible to suppress the tailing current of the driver-dedicated MOS transistor. Further, even in the case where the adjustment for ensuring sufficient current drivability and diminishing the tailing current in connection with the gate width W and gate length L of the driver-dedicated MOS transistor, it is possible to make the adjustment effectively.

Where the setting of the threshold voltage of the driver-dedicated MOS transistor shown in FIGS. 10 to 13 is applied to the circuit configuration of FIG. 2, not only the same functions and effects as in the case of FIG. 3 are obtained, but also it is possible to freely diminish the tailing current of the driver-dedicated MOS transistor, so that the gate width W and gate length L of the driver-dedicated MOS transistor can be changed more freely. Moreover, the functions and effects obtained by the circuit configuration of FIG. 2 can be further enhanced.

It goes without saying that the present invention is not limited to the above embodiment, but that various improvements and modifications may be made within the scope not departing from the gist of the present invention.

For example, in FIGS. 3 to 5 illustrating the embodiment, reference has been made to a ring-shaped gate with respect to the sense amplifier-dedicated NMOS transistors SN and SN0_ to SN3 and SN3_, but no limitation is made to the ring shape.

Moreover, although reference has been made to driver-dedicated MOS transistors for sense amplifiers, this constitutes no limitation and like application may be made also to other circuit portions.

Although reference has been made to the memory cell array structure with complementary bit lines, no limitation is made thereto.

Further, it goes without saying that the semiconductor memory device as referred to herein covers not only LSI alone but also one mounted as memory macro on system LSI or the like.

According to the present invention, in connection with a driver transistor for the supply of electric power to a sense amplifier, it is possible to provide a semiconductor memory device capable of supplying electric power to the sense amplifier while ensuring sufficient current drivability at the time of activation and capable of diminishing a leakage current in the driver transistor at the time of inactivation.

What is claimed is:

1. A semiconductor memory device comprising:
    at least one sense amplifier disposed in at least one sense amplifier layout region correspondingly to a wiring pitch of bit lines; and
    at least one driver-dedicated MOS transistor for the supply of electric power to the sense amplifier, the driver-dedicated MOS transistor being disposed in the sense amplifier layout region in such a manner that its gate width is oriented perpendicularly to the wiring direction of the bit lines,
    wherein a power terminal of the sense amplifier and a drain terminal of the driver-dedicated MOS transistor are connected with each other through a low resistance wiring layer.

2. A semiconductor memory device according to claim 1, wherein the driver-dedicated MOS transistor is provided for each predetermined number of the sense amplifiers.

3. A semiconductor memory device according to claim 1, further including, in addition to the driver-dedicated MOS transistor, at least one auxiliary driver-dedicated MOS transistor for assisting at least one of the driver-dedicated MOS transistors.

4. A semiconductor memory device according to claim 3, wherein:
    the sense amplifier layout region and a word line driver layout region are arranged in adjacency to each other in a memory cell array region, the word line driver layout region being perpendicular to the sense amplifier layout region and with at least one word line driver disposed therein to make connection control for the bit lines and memory cells, and
    the auxiliary driver-dedicated MOS transistor is disposed in a cross region, the cross region being adjacent to both the sense amplifier layout region and the word line driver layout region.

5. A semiconductor memory device comprising:
    at least one sense amplifier disposed in at least one sense amplifier layout region correspondingly to a wiring pitch of bit lines; and
    at least one driver-dedicated MOS transistor for the supply of electric power to the sense amplifier, the driver-dedicated MOS transistor being disposed in the sense amplifier layout region in such a manner that its gate width is oriented perpendicularly to the wiring direction of the bit lines,
    wherein a power terminal of the sense amplifier and a drain terminal of the driver-dedicated MOS transistor are directly connected with each other by a constituent layer of both the terminals, and an auxiliary path is formed in at least a partial region by a low resistance wiring layer.

6. A semiconductor memory device comprising:
    at least one sense amplifier disposed in at least one sense amplifier layout region correspondingly to a wiring pitch of bit lines; and
    at least one driver-dedicated MOS transistor for the supply of electric power to the sense amplifier, the driver-dedicated MOS transistor being disposed in the sense amplifier layout region in such a manner that its gate width is oriented perpendicularly to the wiring direction of the bit lines,
    wherein the driver-dedicated MOS transistor has a gate length adjustable region between source and drain terminals thereof, the gate length adjustable region permitting a gate layer to be disposed therein which gate layer has a gate length larger than a shortest length value.

7. A semiconductor memory device comprising:
    a multitude of sense amplifier blocks, the sense amplifier blocks each having in one and same region a predetermined number of sense amplifiers and a driver-dedicated MOS transistor for the supply of electric power to the predetermined number of the sense amplifiers; and a low resistance wiring layer for connecting between the sense amplifier blocks by connecting between power terminals of the predetermined number of the sense amplifiers or connecting between a power output terminal and other power output terminal of respective driver-dedicated MOS transistors in the sense amplifier blocks.

8. A semiconductor memory device according to claim 7, wherein at least one of a source terminal and a drain terminal of each driver-dedicated MOS transistor is connected through a contact layer to a low resistance wiring layer which is provided for each driver-dedicated MOS transistor, and connection or non-connection for each driver-dedicated MOS transistor is selected by selecting arrangement or non-arrangement of the contact layer or the low resistance wiring layer for each driver-dedicated MOS transistor.

9. A semiconductor memory device including at least one driver-dedicated MOS transistor for the supply of electric power to at least one sense amplifier, wherein in an inactive state not involving an access operation, a difference in applied voltage at a gate terminal relative to a source terminal of the driver-dedicated MOS transistor is reverse-biased relative to a voltage difference in a conductive state.

10. A semiconductor memory device according to claim 9, wherein in case of the driver-dedicated MOS transistor being an NMOS transistor, the reverse bias is a negative voltage difference, while in case of the driver-dedicated MOS transistor being a PMOS transistor, the reverse bias is a positive voltage difference.

11. A semiconductor memory device according to claim 10, further including a negative voltage generating circuit for the supply of a bias voltage of a p-type well or a p-type substrate or a word line inactivating voltage, and wherein in case of the reverse bias being the negative voltage difference, the voltage applied to the gate terminal is the bias voltage or the word line inactivating voltage or a negative voltage generated on the basis of the bias voltage or the word line inactivating voltage.

12. A semiconductor memory device according to claim 11 further including a first switching unit for switching between a reference voltage and the bias voltage or the word line inactivating voltage, as the voltage applied to the gate terminal, wherein the first switching unit used is disposed in a cross region in which a sense amplifier layout region with the sense amplifier disposed therein and a word line driver layout region with a word line driver disposed therein cross each other.

13. A semiconductor memory device according to claim 11, further including a first level shifter for shifting the voltage level of a control signal from a reference voltage, the control signal functioning to control the supply of the bias voltage or the word line inactivating voltage to the gate terminal, the first level shifter being not disposed in a cross region in which a sense amplifier layout region with the sense amplifier disposed therein and a word line driver layout region with a word line driver disposed therein cross each other.

14. A semiconductor memory device according to claim 10, further including a boosting voltage generating circuit, and wherein in case of the reverse bias being the positive voltage difference, the voltage applied to the gate terminal is a word line activating voltage or a boosting voltage generated on the basis of the word line activating voltage.

15. A semiconductor memory device according to claim 14 further including a second switching unit for switching between a supply voltage and the word line activating voltage as the voltage applied to the gate terminal, wherein the second switching unit used is disposed in a cross region in which a sense amplifier layout region with the sense amplifier disposed therein and a word line driver layout region with a word line driver disposed therein cross each other.

16. A semiconductor memory device according to claim 14, further including a second level shifter for shifting the voltage level of a control signal from a supply voltage, the control signal functioning to control the supply of the word line activating voltage to the gate terminal, the second level shifter being not disposed in a cross region in which a sense amplifier layout region with the sense amplifier disposed therein and a word line driver layout region with a word line driver disposed therein cross each other.

17. A semiconductor memory device according to claim 10, further including an internal step-down voltage generating circuit for the supply of an internal supply voltage stepped down from an external supply voltage to an internal circuit, and wherein in case of the reverse bias being the positive voltage difference, the voltage applied to the gate terminal is the external supply voltage or a voltage higher than the internal supply voltage generated on the basis of the external supply voltage.

18. A semiconductor memory device according to claim 9, wherein the driver-dedicated MOS transistor is provided for each predetermined number of the sense amplifiers.

19. A semiconductor memory device according to claim 9, further including, in addition to the driver-dedicated MOS transistor, at least an auxiliary driver-dedicated MOS transistor for assisting the driver-dedicated MOS transistor.

20. A semiconductor memory device according to claim 19, wherein:
a sense amplifier layout region with the sense amplifier disposed therein and a word line driver layout region are arranged in adjacency to each other in a memory cell array region, the word line driver layout region being perpendicular to the sense amplifier layout region and with at least one word line driver disposed therein to make connection control for bit lines and memory cells, and
the auxiliary driver-dedicated MOS transistor is disposed in a cross region, the cross region being adjacent to both the sense amplifier layout region and the word line driver layout region.

21. A semiconductor memory device including at least one driver-dedicated MOS transistor for the supply of electric power to at least one sense amplifier, wherein in an active state of the sense amplifier, a difference in applied voltage at a gate terminal relative to a source terminal of the driver-dedicated MOS transistor is forward-biased more deeply than a voltage difference in a conductive state.

22. A semiconductor memory device according to claim 21 wherein in case of the driver-dedicated MOS transistor being an NMOS transistor, the forward bias is a positive voltage difference larger than a supply voltage difference, while in case of the driver-dedicated MOS transistor is a PMOS transistor, the forward bias is a negative voltage difference larger than the supply voltage difference.

23. A semiconductor memory device including driver-dedicated MOS transistor for the supply of electric power to a sense amplifier, the driver-dedicated MOS transistor being deeper in threshold voltage than a sense amplifier-dedicated MOS transistor which constitutes the sense amplifier.

24. A semiconductor memory device according to claim 23, wherein the driver-dedicated MOS transistor and the sense amplifier-dedicated MOS transistor are arranged in one and same well and are different in impurity concentration in respective channel regions.

25. A semiconductor memory device according to claim 23, wherein the driver-dedicated MOS transistor and the sense amplifier-dedicated MOS transistor are arranged in different wells, the well with the driver-dedicated MOS transistor disposed therein having an impurity concentration higher than that of the well with the sense amplifier-dedicated MOS transistor disposed therein.

26. A semiconductor memory device according to claim 23, wherein the driver-dedicated MOS transistor and the sense amplifier-dedicated MOS transistor are arranged in different wells, a first back gate bias to the well with the driver-dedicated MOS transistor disposed therein being a deeper reverse bias than a second back gate bias to the well with the sense amplifier-dedicated MOS transistor disposed therein.

27. A semiconductor memory device according to claim 26, further including a negative voltage generating circuit for the supply of a word line inactivating voltage, and wherein when the driver-dedicated MOS transistor is an NMOS transistor and is disposed in a P-type well, the first back gate bias is the word line inactivating voltage or a negative voltage generated on the basis of the word line inactivating voltage and lower than the second back gate bias.

28. A semiconductor memory device according to claim 26, further including a boosting voltage generating circuit for the supply of a word line activating voltage, and wherein when the driver-dedicated MOS transistor is a PMOS transistor and is disposed in an N-type well, the first back gate bias is the word line activating voltage or a positive voltage generated on the basis of the word line activating voltage and higher than the second back gate bias.

29. A semiconductor memory device according to claim 26, further including an internal step-down voltage generating circuit for the supply of an internal supply voltage stepped down from the external supply voltage to an internal circuit, and wherein when the driver-dedicated MOS transistor is a PMOS transistor and is disposed in an N-type well, the first back gate bias is the external supply voltage or a positive voltage generated on the basis of the external supply voltage and higher than the second back gate bias.

30. A semiconductor memory device according to claim 23, wherein the driver-dedicated MOS transistor is provided for each predetermined number of the sense amplifiers.

31. A semiconductor memory device according to claim 23, further including, in addition to the driver-dedicated MOS transistor, at least one auxiliary driver-dedicated MOS transistor for assisting the driver-dedicated MOS transistor.

32. A semiconductor memory device according to claim 31, wherein:
   a sense amplifier layout region with the sense amplifier disposed therein and a work line driver layout region are arranged in adjacency to each other in a memory cell array region, the word line driver layout region being perpendicular to the sense amplifier layout region and with at least one word line driver disposed therein to make connection control for bit lines and memory cells, and
   the auxiliary driver-dedicated MOS transistor is disposed in a cross region, the cross region being adjacent to both the sense amplifier layout region and the word line driver layout region.

33. A semiconductor memory device according to claim 31, wherein the auxiliary driver-dedicated MOS transistor is deeper in threshold voltage than the sense amplifier-dedicated MOS transistor.

34. A semiconductor memory device according to claim 33, wherein the auxiliary driver-dedicated MOS transistor and the sense amplifier-dedicated MOS transistor are arranged in one and same well and are different in impurity concentration in respective channel regions.

35. A semiconductor memory device according to claim 33, wherein the auxiliary driver-dedicated MOS transistor and the sense amplifier-dedicated MOS transistor are arranged in different wells, the well with the auxiliary driver-dedicated MOS transistor disposed therein having an impurity concentration higher than that of the well with the sense amplifier-dedicated MOS transistor disposed therein.

36. A semiconductor memory device according to claim 33, wherein the auxiliary driver-dedicated MOS transistor and the sense amplifier-dedicated MOS transistor are arranged in different wells, a first back gate bias to the well with the auxiliary driver-dedicated MOS transistor disposed therein being a deeper reverse bias than a second back gate bias to the well with the sense amplifier-dedicated MOS transistor disposed therein.

* * * * *